United States Patent [19]
Shiratake

[11] Patent Number: 5,959,908
[45] Date of Patent: Sep. 28, 1999

[54] SEMICONDUCTOR MEMORY DEVICE HAVING SPARE WORD LINES

[75] Inventor: Shinichiro Shiratake, Yokohama, Japan

[73] Assignee: Kubushiki Kaisha Toshiba, Kawasaki, Japan

[21] Appl. No.: 09/084,927

[22] Filed: May 28, 1998

[30] Foreign Application Priority Data

May 30, 1997 [JP] Japan ..................................... 9-142597

[51] Int. Cl.[6] ....................................................... G11C 7/00
[52] U.S. Cl. ...................................... 365/200; 365/230.06
[58] Field of Search ............................... 365/200, 189.07, 365/230.06, 185.09

[56] References Cited

U.S. PATENT DOCUMENTS

| | | |
|---|---|---|
| 4,752,914 | 6/1988 | Nakano et al. .......................... 365/200 |
| 5,047,983 | 9/1991 | Iwai et al. ................................ 365/200 |
| 5,267,205 | 11/1993 | Hamada ................................... 365/200 |
| 5,467,457 | 11/1995 | Kohda et al. ............................ 365/200 |
| 5,586,075 | 12/1996 | Miwa ....................................... 365/200 |
| 5,703,817 | 12/1997 | Shiratake et al. ........................ 365/200 |

*Primary Examiner*—Tan T. Nguyen
*Attorney, Agent, or Firm*—Banner & Witcoff, Ltd.

[57] ABSTRACT

An OR circuit generates a spare word line group selection signal based on output signals of address coincidence detection circuits and the OR circuit generates an upper/low-order selection signal. A spare word line selecting signal generation circuit generates a spare word line selection signal based on the upper/low-order selection signal and common word line selection signal and a word line driving circuit substitutes the spare word line or lines in a redundancy memory cell array in the unit of lines smaller than the number of word lines constructing one word line group in the memory cell array according to the spare word line group selection signal and spare word line selection signal.

21 Claims, 16 Drawing Sheets

WORD LINE ADDRESS
SELECTION SIGNALS

LOW-ORDER SELECTION
SIGNAL LS

UPPER SELECTION
SIGNAL US

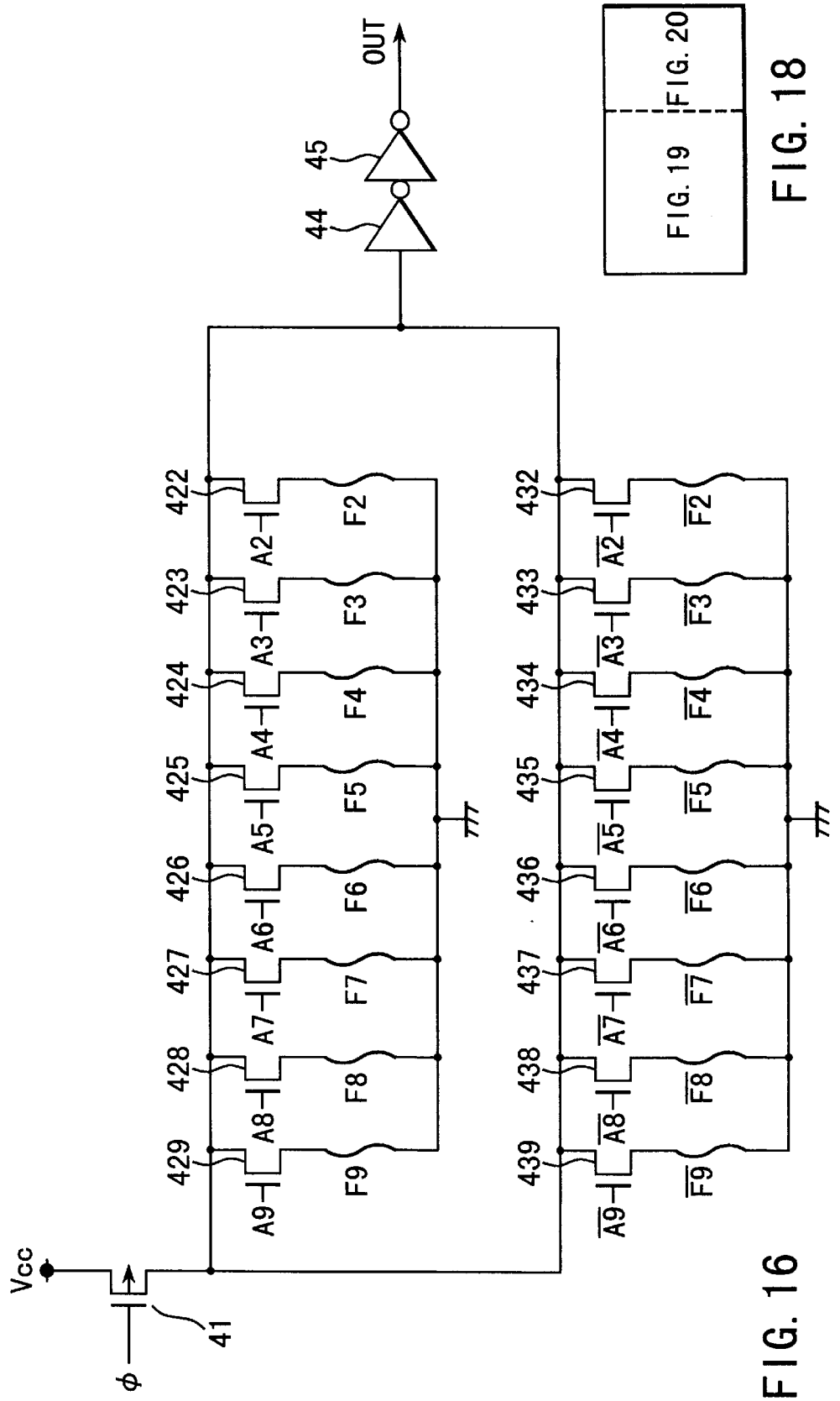

SEMICONDUCTOR MEMORY DEVICE HAVING SPARE WORD LINES

BACKGROUND OF THE INVENTION

This invention relates to a semiconductor memory device having a redundancy circuit, and more particularly to a semiconductor memory device in which a defective word line can be replaced by a spare word line.

With the development of the process technology on the semiconductor substrate, the sizes of elements constructing a semiconductor memory device are dramatically reduced. With the miniaturization of the elements, the processing pitch of wirings in the semiconductor memory device becomes smaller. As a result, the rate of occurrence of defects for each unit area due to deterioration of the retention characteristic of memory cells and the short-circuit of wirings caused by a fluctuation in the process and dusts in the clean room in which the process is effected is increased.

Further, with an increase in the capacity of the semiconductor memory device, the chip area tends to become large. For this reason, the probability that the defect occurs in the semiconductor memory device becomes higher. Therefore, a redundancy circuit for compensating for the defect is provided in the semiconductor memory device. The yield of the memory device production is enhanced by replacing the defect circuit with the redundancy circuit, as required.

However, the defect compensating circuit such as the redundancy circuit increases the chip area. Particularly, the redundancy memory cell increases the chip area.

FIG. 1 shows a conventional semiconductor memory device, for example, a dynamic random access memory (DRAM) and shows the arrangement of a memory cell array and a redundancy memory cell array. In this example, one redundancy memory cell array 12 is arranged for four memory cell arrays 11a to 11d each having 256 word lines. A defective word line occurring in the memory cell arrays 11a to 11d is replaced by a spare word line in the redundancy memory cell array 12. The total number of word lines in the four memory cell arrays is 256×4=1024 and a 10-bit address signal is necessary to separately designate them. In the address signal, the upper eight bits are supplied to row decoders 13a to 13d and a total of 256 word line group selecting signals MWL are output from the row decoders 13a to 13d. A word line group of four adjacent word lines is selected by one of the word line group selecting signals MWL and one of the four word lines is selected by common word line identification signals WSn (n=0 to 3) which are generated by the low-order 2 bits of the address signal. The word line group selecting signals MWL are supplied to a plurality of word line driving circuits (WD) 16n (n=0 to 255) provided in the memory cell arrays 11a to 11d.

The common word line identification signals WSn cause word line selecting signal generation circuits (WSSG) 14a to 14d and 15 provided for the memory cell array 11a to 11d and redundancy memory cell array 12 to generate signals WDRn (n=0 to 3) and signals SWDRn (n=0 to 3). The signals WDRn are supplied to the plurality of word line driving circuits 16n (n=0 to 255) which are provided 64 for each of the memory cell arrays 11a to 11d and the signals SWDRn are supplied to a plurality of word line driving circuits 17n (n=0 to 63) provided for the redundancy memory cell array 12. One of the word lines selected by the signals WDRn among the four-word line group selected by the word line group selecting signal MWL is driven by a corresponding one of the word line driving circuits 16n.

FIG. 2 shows an example of a circuit of the row decoder 13a. The row decoder includes a plurality of AND circuits 20 and each of the AND circuits 20 outputs the logical AND of a specified combination of eight pairs of address signals A2, /A2, to A9, /A9 as one of the signals MWLn (n=0, 1, 2, 3, . . . ).

FIG. 3 shows one example of the word line selecting signal generation circuit (WSSG). The word line selecting signal generation circuit includes a plurality of AND circuits 21. Each of the AND circuits 21 outputs the logical AND of a block selection signal BS generated by the most significant 2 bits of the address signal and a corresponding one of the signals WSn (n=0 to 3) as one of the signals WDRn (n=0 to 3) so as to activate only one of the four memory cell arrays.

FIG. 4 shows one example of the word line driving circuit (WD). The word line driving circuit includes a plurality of AND circuits 22. The AND circuits 22 drive the word lines WLn (n=0 to 3) according to the logical AND of one word line group selecting signal MWL commonly supplied to the four word lines and the four signals WDRn (n=0 to 3).

In the redundancy memory cell array 12 shown in FIG. 1, spare word line group selecting signals SMWL corresponding to the word line group selecting signals MWL are generated by address coincidence detectors (ACD) 18n (n=0 to 3) for detecting the coincidence between the addresses. The address coincidence detectors 18n store addresses of the word line group selecting signals MWL containing defective word lines by use of nonvolatile memory elements such as fuses which can be blown by laser after testing the device. If the upper 8 bits of the address which is supplied to access the memory cell array coincide with the address stored in the ACD, the spare word line group selecting signal SMWL is activated. In this example, since the four address coincidence detectors are used, four defective portions can be compensated for. As the signal SWDRn for selecting one of the four word lines in the selected group, the same signal out of four SWDRn's is selected irrespective of whether or not the word line is replaced by the spare word line. That is, the replacement is performed by activating one of the spare word line selecting signal SMWL instead of the word line selecting signal MWL to which the defective word line belongs. Therefore, the replacement control can be relatively easily effected.

However, with the above method, four word lines are replaced as one unit for one defective word line and if the number of word lines to be replaced independently is increased, it becomes necessary to provide an extremely large number of spare word lines. As, the number and the area of redundancy memories increase as the number of spare word lines increases, the increase of chip area becomes a problem.

BRIEF SUMMARY OF THE INVENTION

An object of this invention is to provide a semiconductor memory device in which the number of redundancy memories can be reduced and an increase in the chip area can be prevented without reducing the number of the replaceable defect word lines.

The above object can be attained by a semiconductor memory device comprising a plurality of memory cell arrays each having a plurality of word lines; at least one redundancy memory cell array having a plurality of spare word lines; a plurality of word line group selection circuits for selecting word line groups each including at least two word lines according to a first portion of an address signal; a plurality of word line selection circuits respectively provided for the plurality of memory cell arrays, for selecting one of the plurality of word lines contained in the word line group which is selected by the word line group selection circuit according to a second portion of the address signal; an address coincidence detection circuit including a plurality of nonvolatile storage circuits for storing an address of a defective word line contained in the word line groups according to part of the first and second portions of the address signal and outputting a coincidence signal when an address signal for selecting the word line of the memory cell array coincides with the address signal stored in the storage circuit; and a replacement circuit provided for the redundancy memory cell array, for activating one of spare word lines of a preset number smaller than the number of word lines constructing the word line group instead of the defective word line according to an output signal of the address coincidence detection circuit.

According to this invention, a number of word lines are replaced by the spare word lines of the same number which is smaller than the number of word lines included in the word line group. An output signal of the address coincidence detection circuit is used to determine which portion of the word line group is replaced by the spare word lines. Therefore, the same number of defective word lines as in the conventional case can be compensated for by use of spare word lines of a number smaller than in the conventional case, and as a result, an increase in the chip area can be suppressed and the cost of fabrication can be lowered.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 16 is a circuit diagram showing an address coincidence detection circuit of FIG. 15;

FIG. 18 is a diagram for illustrating the construction of a fourth embodiment of this invention;

DETAILED DESCRIPTION OF THE INVENTION

There will now be described embodiments of this invention with reference to the accompanying drawings.

(First Embodiment)

Figure 1:
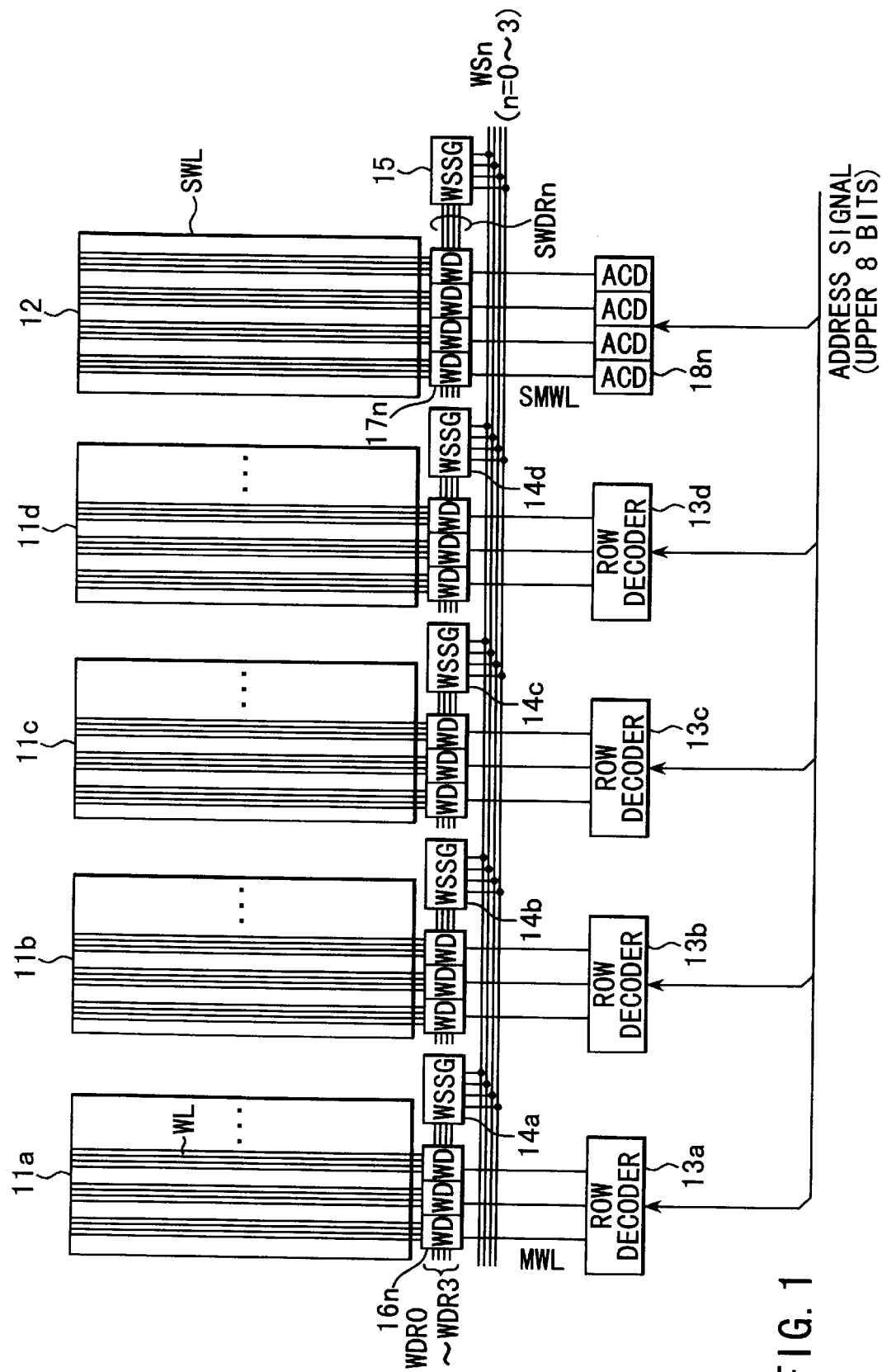
FIG. 1 is a construction diagram showing a conventional semiconductor memory device.
Figure 2:
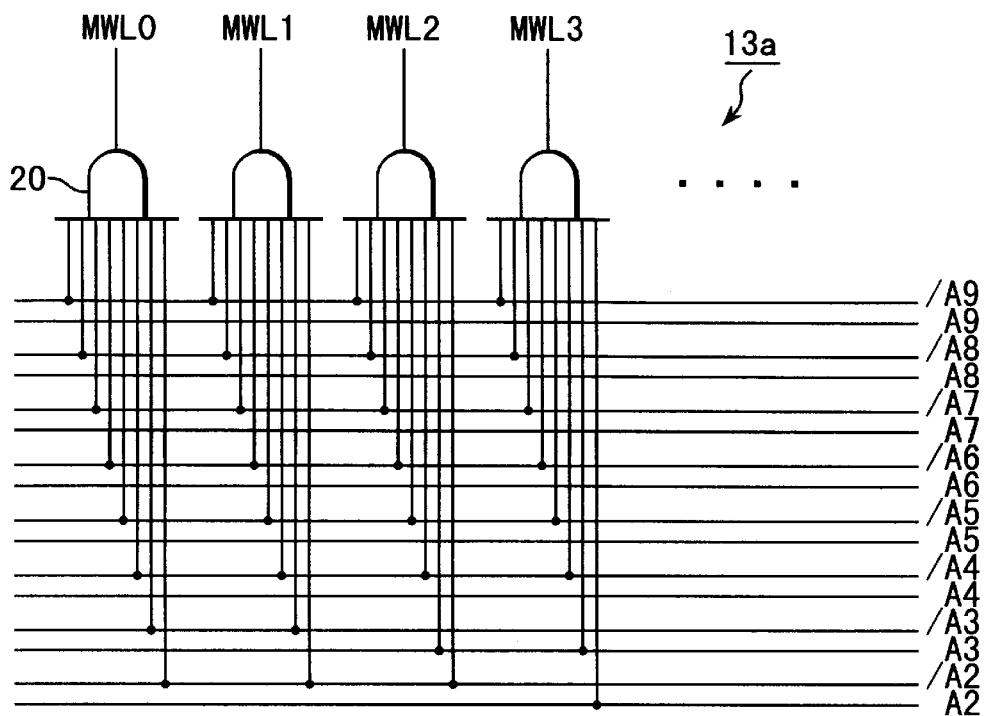
FIG. 2 is a circuit diagram showing a row decoder of FIG. 1.
Figure 3:
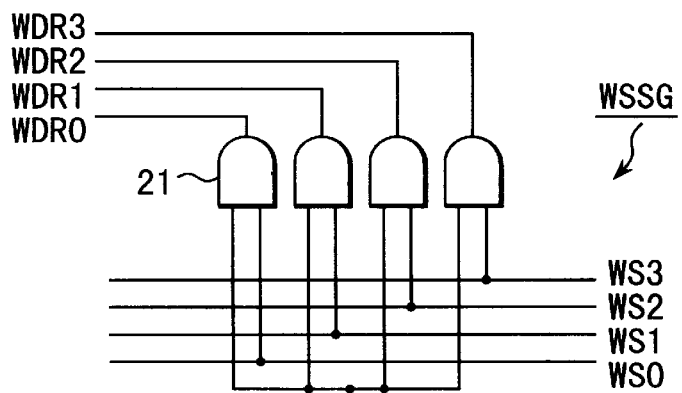
FIG. 3 is a circuit diagram showing a word line selecting signal generation circuit of FIG. 1.
Figure 4:
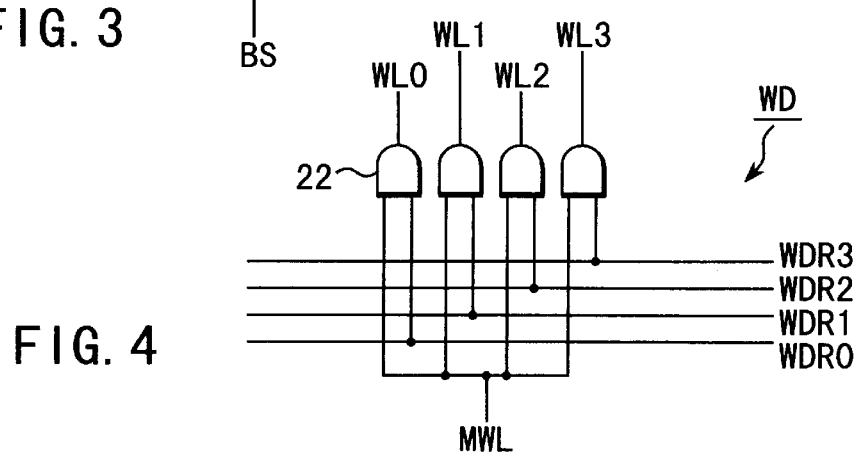
FIG. 4 is a circuit diagram showing a word line driving circuit of FIG. 1.
Figure 5:
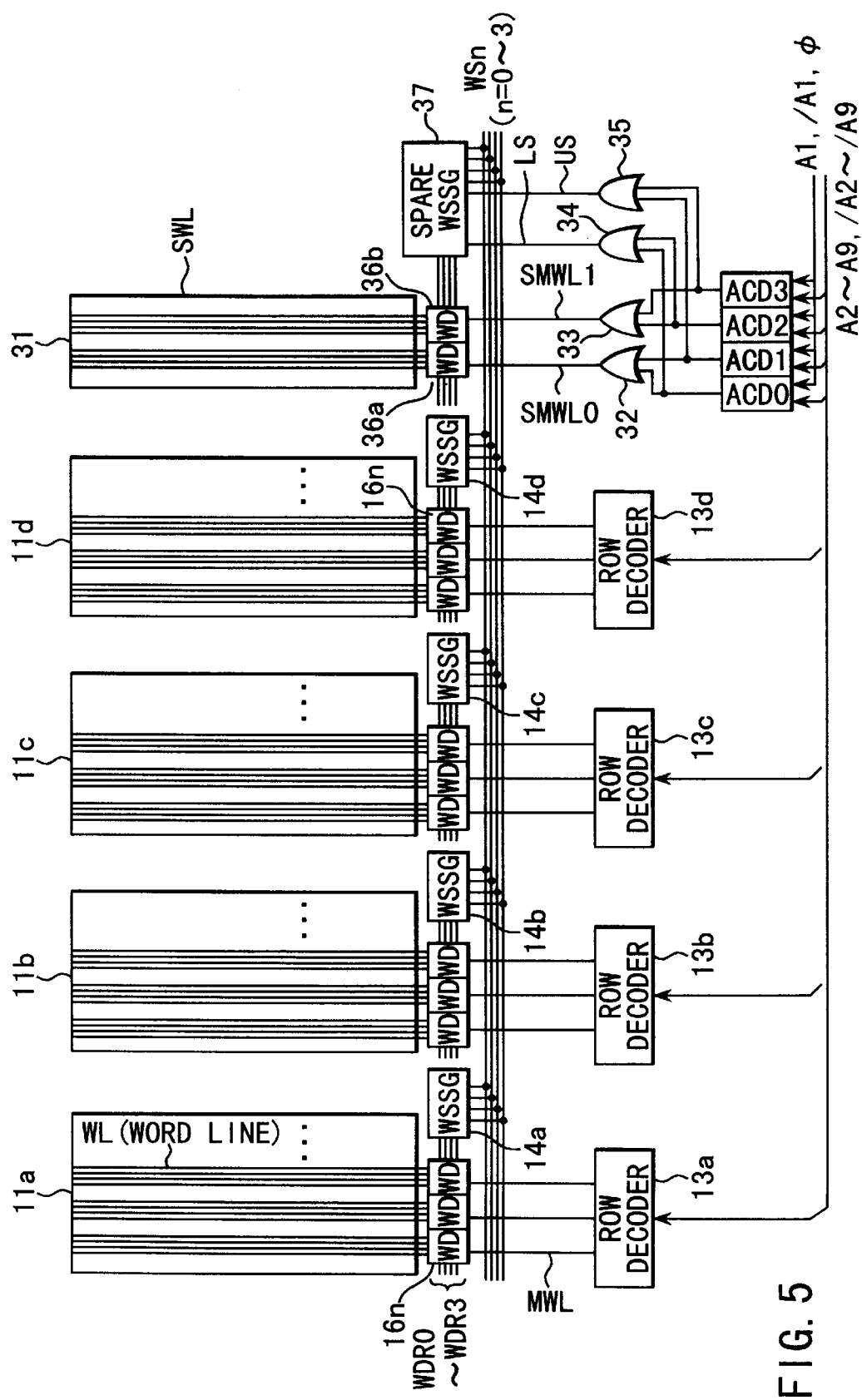
FIG. 5 is a construction diagram showing a first embodiment of this invention.

FIG. 5 shows a first embodiment of this invention and shows the arrangement of memory cell arrays and a redundancy memory cell array. In FIG. 5, portions which are the same as those of FIG. 1 are denoted by the same reference numerals.

In the first embodiment, a plurality of word line groups each including four word lines are used and the word lines can be replaced by spare word lines for every two word lines as one unit. In FIG. 5, like the case of FIG. 1, four memory cell arrays 11a, 11b, 11c, 11d each include 256 word lines WL. One redundancy memory cell array 31 is provided for the four memory cell arrays 11a to 11d. A defective word line or lines occurring in the memory cell arrays 11a to 11d can be compensated for by use of the redundancy memory cell array 31. In FIG. 5, memory cells connected to the word lines WL, spare memory cells connected to the spare word lines and bit lines connected to the memory cells are not illustrated.

Address coincidence detection circuits ACD0 to ACD3 of this embodiment are supplied with upper 8 bit address signals A2 to A9 for selecting the word line group, inversion signals /A2 to /A9 thereof, an upper address signal A1 of the two bit address signals A1 and A0 for identifying common word line identification signals WS0 to WS3, an inversion signal /A1 thereof, and a control signal φ. The address coincidence detection circuits ACD0 to ACD3 each have a 9-bit storage circuit for storing an address of a defective word line and activate an output signal thereof when a supplied address coincides with the stored address. The storage circuit is constructed by nonvolatile circuit elements such as fuses as will be described later.

Output signals of the address coincidence detection circuits ACD0, ACD1 are supplied to an OR circuit 32 and output signals of the address coincidence detection circuits ACD2, ACD3 are supplied to an OR circuit 33. Spare word line group selecting signals SMWL0, SMWL1 are respectively output from the OR circuits 32, 33 and respectively supplied to spare word line driving circuits 36a, 36b. The redundancy memory cell array 31 has two sets of four spare word lines SWL and the four spare word lines SWL are connected to each of the word line driving circuits 36a, 36b.

Further, output signals of the address coincidence detection circuits ACD0, ACD2 are supplied to an OR circuit 34 and output signals of the address coincidence detection circuits ACD1, ACD3 are supplied to an OR circuit 35. If address coincidence is detected by the address coincidence detection circuit ACD0, ACD2, a low-order selecting signal LS is output from the OR circuit 34, and if address coincidence is detected by the address coincidence detection circuit ACD1, ACD3, an upper selecting signal US is output from the OR circuit 35. The low-order selecting signal LS and upper selecting signal US are supplied to a spare word line selecting signal generation circuit 37 together with the common word line identification signals WSn (n=0 to 3).

Figure 6:
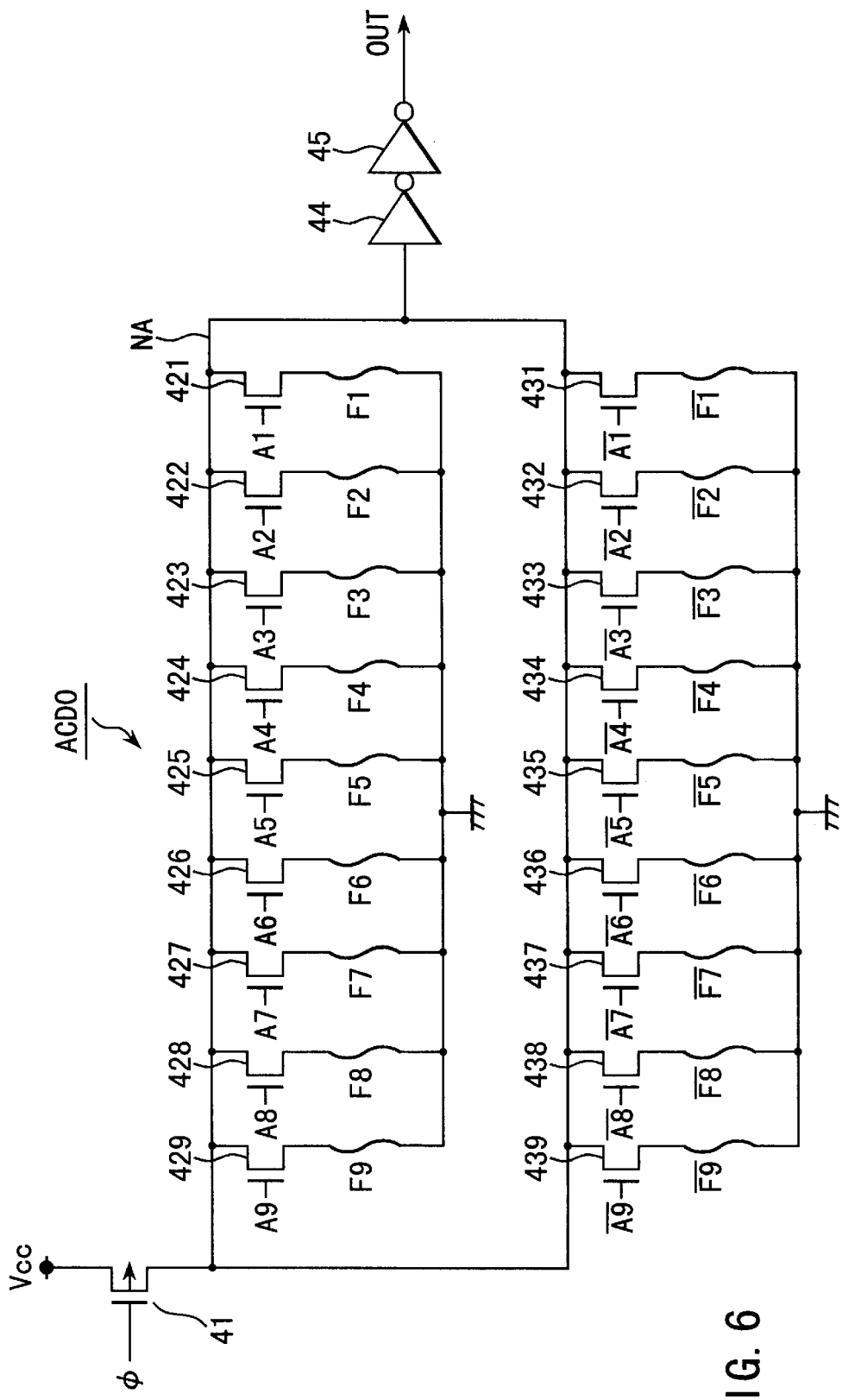
FIG. 6 is a circuit diagram showing an address coincidence detection circuit of FIG. 5.

FIG. 6 shows an example of the address coincidence detection circuits ACD0 to ACD3. Since the address coincidence detection circuits ACD0 to ACD3 have the same construction, only the address coincidence detection circuit ACD0 is explained.

The control signal φ is supplied to the gate of a p-channel transistor 41. One end of the current path of the transistor 41 is connected to a power supply Vcc and the other end of the current path of the transistor 41 is connected to one ends of the current paths of n-channel transistors 421 to 429. For example, fuses F1 to F9 used as address storage elements are connected between the other ends of the current paths of the transistors 421 to 429 and the ground and the gates of the transistors 421 to 429 are respectively supplied with the address signals A1 to A9. Further, the other end of the current path of the transistor 41 is connected to one ends of the current paths of n-channel transistors 431 to 439. Fuses /F1 to /F9 are connected between the other ends of the current paths of the transistors 431 to 439 and the ground and the gates of the transistors 431 to 439 are respectively supplied with the address signals /A1 to /A9. Further, inverters 44, 45 are serially connected to the other end of the current path of the transistor 41. The fuses F1 to F9, /F1 to /F9 are selectively cut off by a laser beam, for example, according to the defective address to store the defective address. For example, if the word line which is selected by an address having all of A1 to A9 of "0", all of nine fuses /F1 to /F9 are cut off.

The address storing elements are not limited to fuses and nonvolatile memories may be used.

Figure 7:
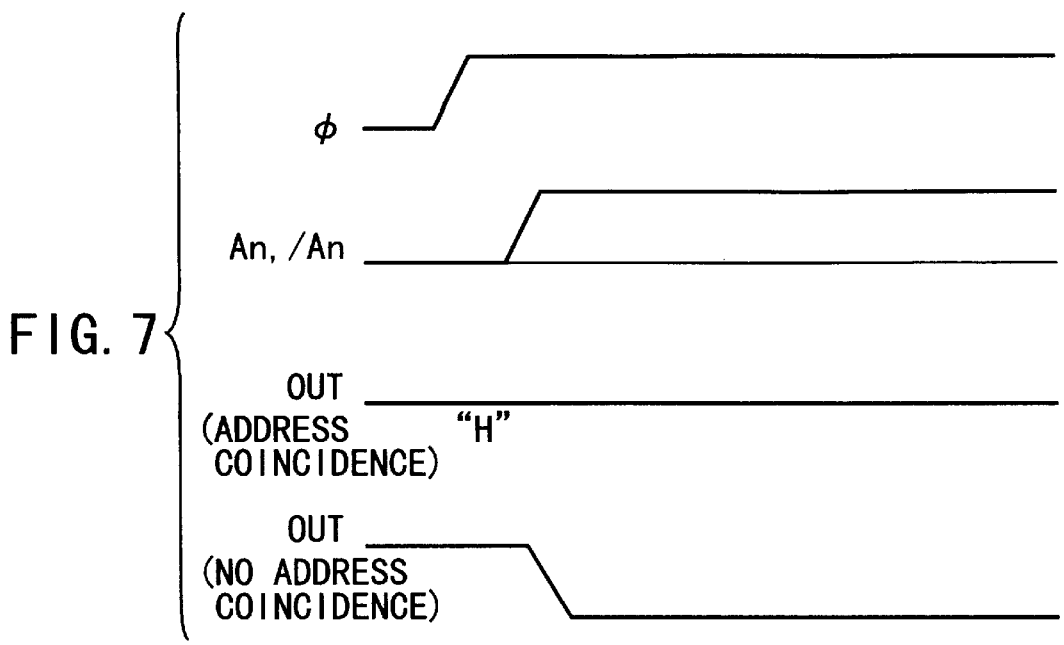
FIG. 7 is a timing chart for illustrating the operation of the circuit of FIG. 6.

FIG. 7 shows the operation of the address coincidence detection circuit.

First, the control signal φ is set to the low level in the standby state and all of the address signals An, /An (n=1 to 9) are also set to the low level. Therefore, the transistor 41 is turned ON and the transistors 421 to 429, 431 to 439 are turned OFF so that the node NA will be precharged to the high level irrespective of the cut-off states of the fuses.

After this, if access to the word line is made, the control signal φ is changed from the low level to the high level so that the transistor 41 will be turned OFF and the address signals An, /An (n=1 to 9) are input. That is, one of the address signals An and /An is shifted from the low level to the high level. For example, if the address signal An=1, An is shifted to the high level, and if An=0, /An is shifted to the high level. At this time, an output signal OUT of the coincidence detection circuit becomes as follows according to the cut-off states of the fuses. That is, if the fuses corresponding to all of the bits of the address are cut off, the output signal is kept at the high level, and if an address containing at least one bit different from the bit corresponding to the cut-off fuse is input, the output signal OUT is shifted to the low level. For example, if all of the address signals A1 to A9 are "0" when the nine fuses /F1 to /F9 are all cut off, the output signal OUT is kept at the high level, and if an address other than the above case is input, the output signal OUT is shifted to the low level. That is, when an address represented by the cut-off states of the fuses coincides with the address of a word line to be accessed, the output signal OUT of the coincidence detection circuit is set to the high level and when the addresses do not coincide with each other, the output signal is set to the low level.

In FIG. 5, the spare word line group selection signal SMWL0 output from the OR circuit 32 is activated when the output signal of the address coincidence detection circuit ACD0 or ACD1 is set to the high level, and the spare word line group selecting signal SMWL1 is activated when the output signal of the address coincidence detection circuit ACD2 or ACD3 is set to the high level. That is, the spare word line group selecting signal SMWL0 is activated when access to the word line of an address represented by the cut-off information of the fuses contained in the address coincidence detection circuit ACD0 is made or when access to the word line of an address represented by the cut-off information of the fuses contained in the address coincidence detection circuit ACD1 is made.

Further, the low-order selection signal LS output from the OR circuit 34 is generated according to the output signal of the address coincidence detection circuit ACD0 or ACD2 and the upper selection signal US output from the OR circuit 35 is generated according to the output signal of the address coincidence detection circuit ACD1 or ACD3.

The common word line identification signals WS0 to WS3 are selectively activated according to the states of the lower 2 bits of the address signals. That is, WS0 is activated in the case of A1="0" and A0="0", WS1 is activated in the case of A1="0" and A0="1", WS2 is activated in the case of A1="1" and A0="0", and WS3 is activated in the case of A1="1" and A0="1".

Figure 8:
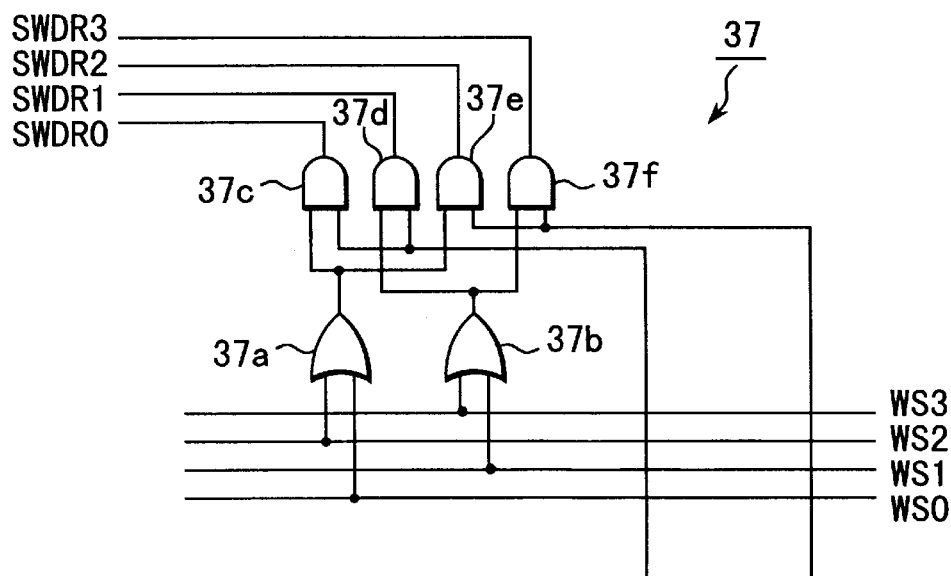
FIG. 8 is a circuit diagram showing a spare word line selecting signal generation circuit of FIG. 5.

FIG. 8 shows one example of the spare word line selecting signal generation circuit 37. In FIG. 8, the common word line identification signals WS0, WS2 are supplied to the input terminals of an OR circuit 37a, and the common word line identification signals WS1, WS3 are supplied to the input terminals of an OR circuit 37b. An output signal of the OR circuit 37a and the low-order selection signal LS are supplied to the input terminals of an AND circuit 37c and an output signal of the OR circuit 37b and the low-order selection signal LS are supplied to the input terminals of an AND circuit 37d. An output signal of the OR circuit 37a and the upper selection signal US are supplied to the input terminals of an AND circuit 37e and an output signal of the OR circuit 37b and the upper selection signal US are supplied to the input terminals of an AND circuit 37f. The signals SWDR0 to SWDR3 for selecting one of the four word lines are output from the output terminals of the AND circuits 37c to 37f. The signals SWDR0 to SWDR3 are supplied to the word line driving circuits 36a, 36b.

In the above circuit, in a case where the low-order selection signal LS is activated, the spare word line group selecting signal SWDR0 is activated if the signal WS0 or WS2 is activated, and the spare word line group selecting signal SWDR1 is activated if the signal WS1 or WS3 is activated. Further, in a case where the upper selection signal US is activated, the spare word line group selecting signal SWDR2 is activated if the signal WS0 or WS2 is activated, and the spare word line group selecting signal SWDR3 is activated if the signal WS1 or WS3 is activated.

Figure 9:
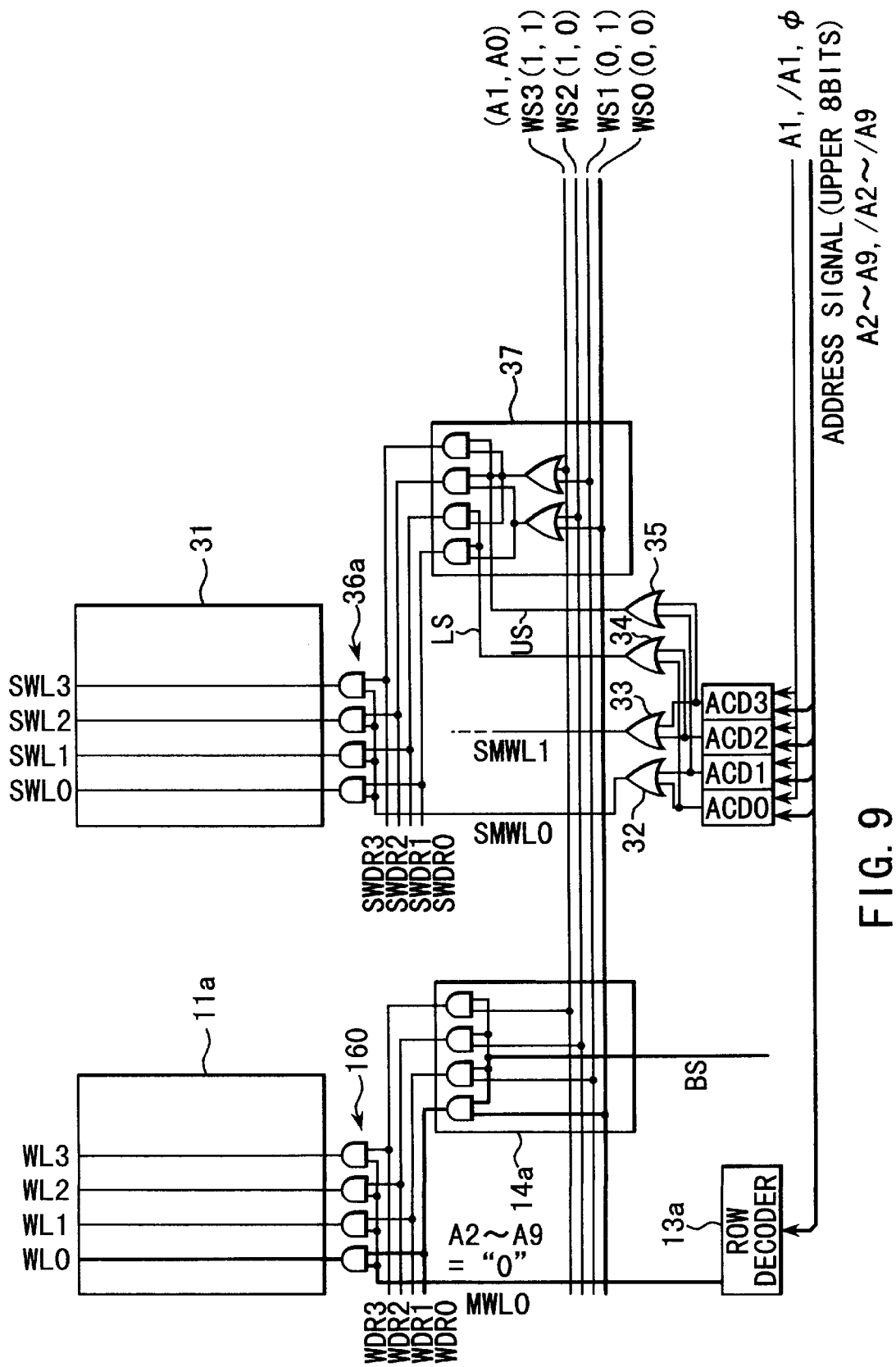
FIG. 9 is a schematic construction diagram showing the operation of the circuit of FIG. 5.
Figure 10:
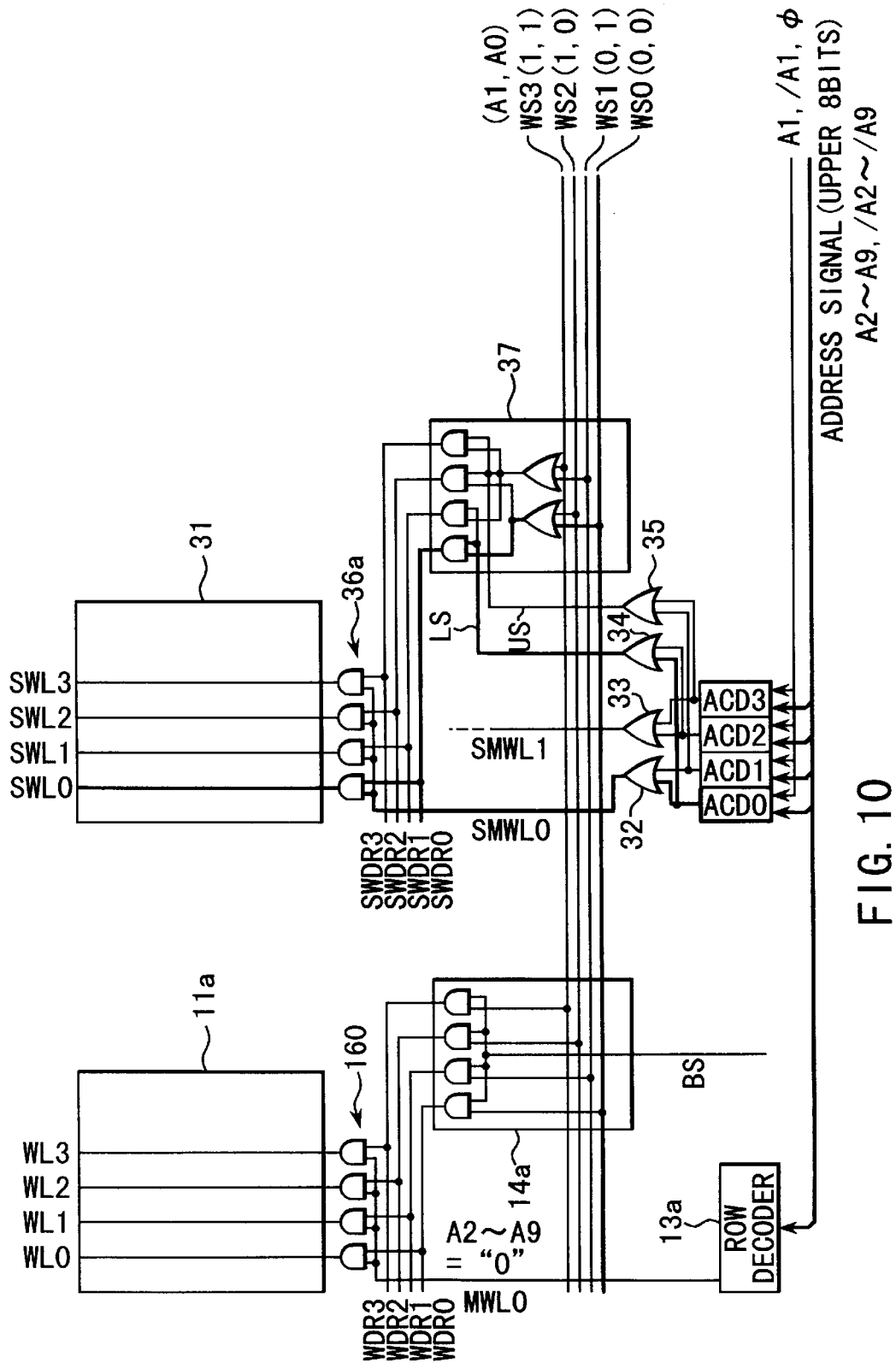
FIG. 10 is a schematic construction diagram showing the operation of the circuit of FIG. 5.
Figure 11:
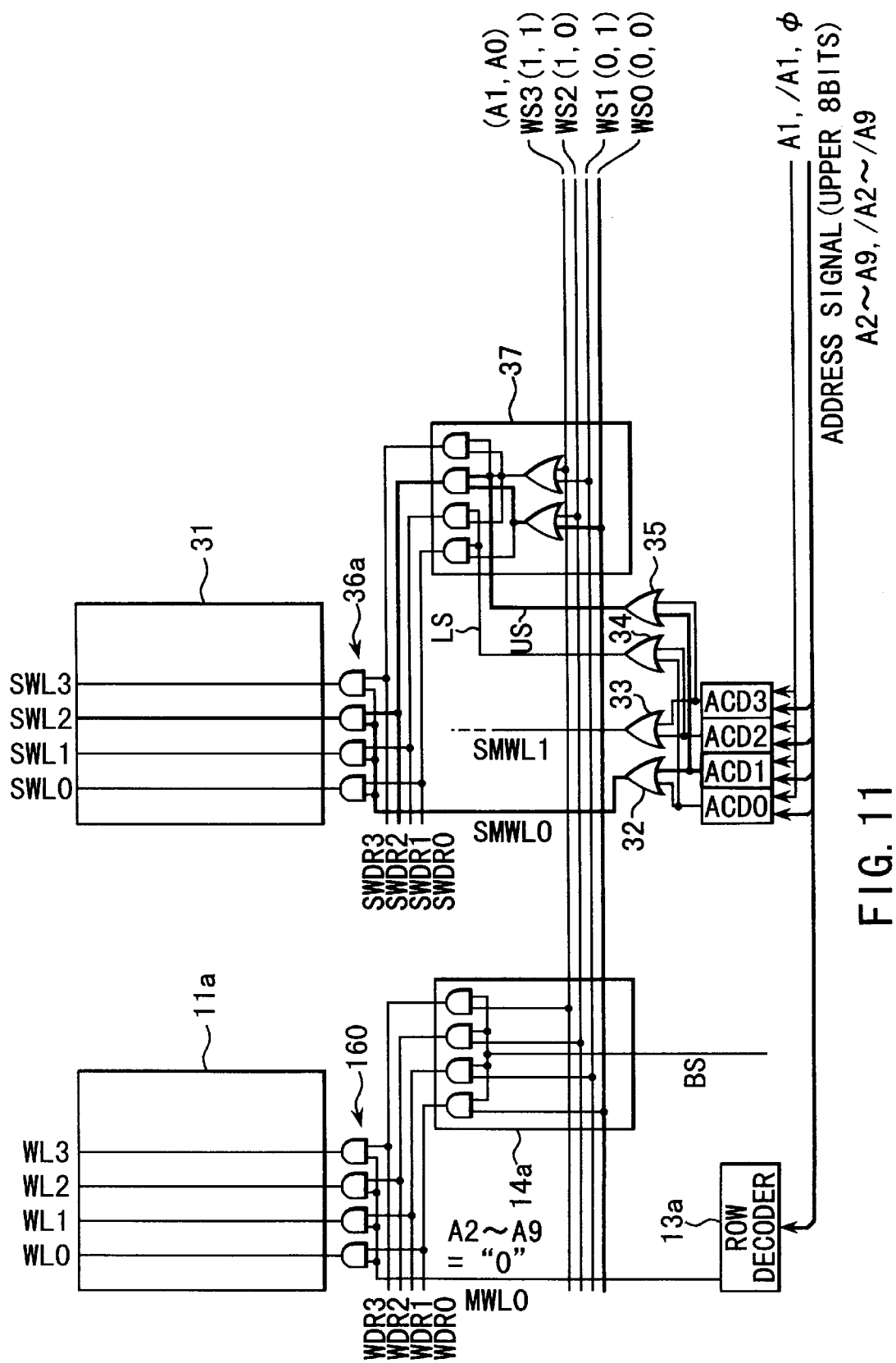
FIG. 11 is a schematic construction diagram showing the operation of the circuit of FIG. 5.

Next, the redundancy replacement operation is explained with reference to FIGS. 9 to 11. FIGS. 9 to 11 show only the main portion of FIG. 5. The activated signals are indicated as bold lines in these figures.

First, the operation prior to the redundancy replacement is explained with reference to FIG. 9.

This example shows a case wherein access is made to the word line WL0 selected by the address in which all of A0 to A9 are "0". Since A1=A0="0", the common word line identification signal WS0 is activated and the word line group selection signal MWL0 selected by the address signals A2 to A9 in the row decoder 13a is activated (in the drawing, activated portions are indicated by thick lines). At this time, a block selection signal BS indicating the memory cell array containing the word line WL0 is activated and the common word line identification signal WS0 is activated so that the word line selection signal WDR0 will be activated. Further, the word line WL0 is selectively activated by the word line driving circuit 14a by activating the word line selection signal WDR0 and word line group selection signal MWL0.

FIGS. 10, 11 show a case wherein the word line WL0 becomes defective and is replaced by a spare word line. In FIG. 10, fuses constructing the address coincidence detection circuit ACD0 are selectively cut off to represent the upper 9 bits of the address of the word line WL0.

That is, nine fuses of /F1 to /F9 in FIG. 6 are cut off. Therefore, if access is made to the word line designated by an address in which all of the address signals A1 to A9 are "0", an output signal of the address coincidence detection circuit ACD0 is activated irrespective of the value of the address signal A0 and the spare word line group selection signal SMWL0 output from the OR circuit 32 is activated. At this time, the low-order selection signal LS output from the OR circuit 34 is activated, and if the common word line identification signal WS0 is activated, the spare word line selection signal SWDR0 output from the spare word line selecting signal generation circuit 37 is activated and the spare word line SWL0 is selected by the word line driving circuit 36a.

Further, if the common word line identification signal WS1 is activated, the spare word line selection signal SWDR1 output from the spare word line selecting signal generation circuit 37 is activated and the spare word line SWL1 is selected by the word line driving circuit 36a. That is, if the address signal A0="0", the spare word line SWL0 is selected instead of the word line WL0, and if the address signal A0="1", the spare word line SWL1 is selected instead of the word line WL1. However, when WL2 or WL3 is to be activated, the address coincidence circuit ACD0 is not activated because the address signal A1="1". In this case, the replacement of word line WL2 and WL3 by the spare word lines does not occur even though the same word line group selection signal MWL0 as in the case of WL0 and WL1 is activated.

FIG. 11 shows a case wherein the fuses of the address coincidence detection circuit ACD1 are selectively cut off to represent upper 9 bits of the address designating the word line WL0. If access is made to the word line selected by an address in which all of the address signals A1 to A9 are "0", an output signal of the address coincidence detection circuit ACD1 is activated irrespective of the value of the address signal A0. Therefore, the spare word line group selection signal SMWL0 output from the OR circuit 32 is activated and the upper selection signal US output from the OR circuit 35 is activated. As a result, if the common word line identification signal WS0 is activated, the spare word line selection signal SWDR2 output from the spare word line selecting signal generation circuit 37 is activated and the spare word line SWL2 is activated by the word line driving circuit 36a. Further, if the common word line identification signal WS1 is activated, the spare word line selection signal SWDR3 output from the spare word line selecting signal generation circuit 37 is activated and the spare word line SWL3 is activated by the word line driving circuit 36a. That is, if the address signal A0="0", the spare word line SWL2 is selected instead of the word line WL0, and if the address signal A0="1", the spare word line SWL3 is selected instead of the word line WL1.

Likewise, when the redundancy replacement is effected by use of the address coincidence detection circuit ACD2, SWL0, SWL1 are respectively activated instead of the word lines WL0, WL1, and when the redundancy replacement is effected by use of the address coincidence detection circuit ACD3, SWL2, SWL3 are respectively activated instead of the word lines WL0, WL1.

Further, when a word line designated by an address in which the second lower bit A1="1" becomes defective, SWL0, SWL1 are respectively activated instead of the word lines WL2, WL3 in the redundancy replacement by the address coincidence detection circuit ACD0 or ACD2.

The circuit operation of this embodiment can be summarized as indicated by the table 1.

TABLE 1

| upper/low-order selection signal | A1 | A0 | Selected WS | activated SWDR |
| --- | --- | --- | --- | --- |
| Low | 0 | 0 | WS0 | SWDR0 |
| Low | 0 | 1 | WS1 | SWDR1 |
| Low | 1 | 0 | WS2 | SWDR0 |
| Low | 1 | 1 | WS3 | SWDR1 |
| Upper | 0 | 0 | WS0 | SWDR2 |
| Upper | 0 | 1 | WS1 | SWDR3 |
| Upper | 1 | 0 | WS2 | SWDR2 |
| Upper | 1 | 1 | WS3 | SWDR3 |

Thus, when the low-order selection signal is activated, a set of the word lines WL0 and WL1 or a set of the word lines WL2 and WL3 is replaced by a set of the spare word lines SWL0 and SWL1, and when the upper selection signal is activated, a set of the word lines WL0 and WL1 or a set of the word lines WL2 and WL3 is replaced by a set of the spare word lines SWL2 and SWL3. That is, the upper selection signal and low-order selection signal are used to replace the upper bit A1 of the 2-bit address signals A0, A1 for identifying the common word line identification signals WS0, WS1, WS2, WS3 and set one of the spare word line selection signals SWDR0 to SWDR3 to be activated. That is, when the upper selection signal is activated, the address signal of the spare word lines A1 is forced to be "1", and when the low-order selection signal is activated, the address signal A1 is forced to be "0".

According to the first embodiment, the number of word lines to be replaced as one unit can be reduced from four which is the selection unit of the word line group selection signal MWL to two without modifying the word line driving circuit, and without changing the activation state of the common word line identification signals WS0 to WS3 irrespective of whether the redundancy replacement is effected or not. Therefore, according to this embodiment, even though four defective portions can be compensated for like the conventional case, the scale of the redundancy memory cell array can be made to correspond to eight word lines and the number of word lines can be reduced to half the 16 word lines used in the conventional case. Therefore, an increase in the chip area by the redundancy memory cell array can be prevented.

In the case of the first embodiment, the area of the circuits is increased because a plurality of OR circuits are arranged on the output terminals of the address coincidence detection circuits ACD0 to ACD3, but since the address coincidence detection circuits and OR circuits can be arranged in an available space in the chip, an increase in the chip area by an increase in the number of these circuits can be prevented.

(Second Embodiment)

Figure 12:
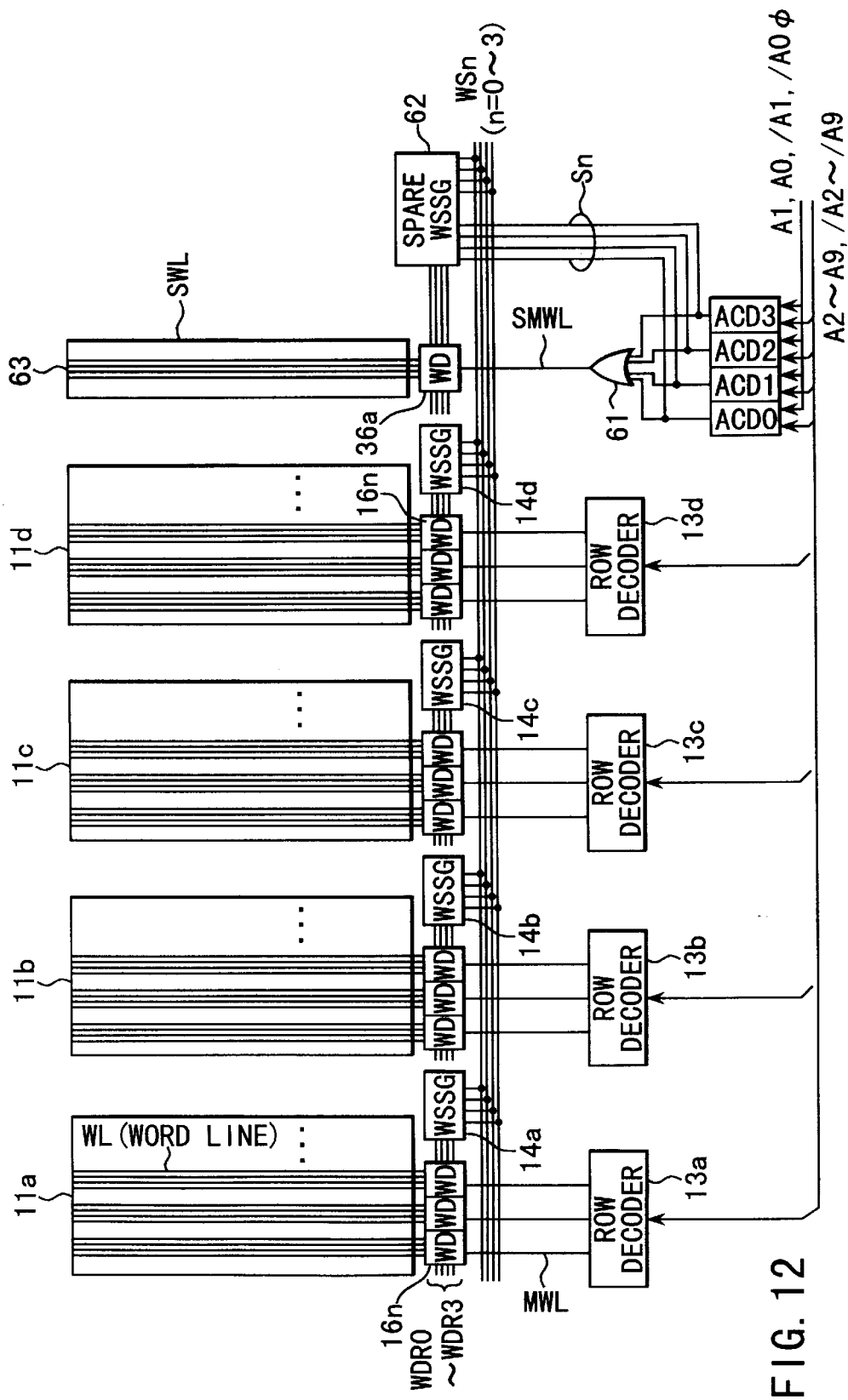
FIG. 12 is a construction diagram showing a second embodiment of this invention.

FIG. 12 shows a second embodiment of this invention. In FIG. 12, portions which are the same as those of FIG. 5 are denoted by the same reference numerals and different portions are explained.

In FIG. 12, address coincidence detection circuits ACD0 to ACD3 are supplied with whole address signals A0 to A9, inversion signals /A0 to /A9 thereof, and a control signal φ. Output signals (word line address selection signals Sn (n=0 to 3)) of the address coincidence detection circuits ACD0 to ACD3 are supplied to an OR circuit 61 and spare word line selecting signal generation circuit 62. A spare word line group selecting signal SMWL output from the OR circuit 61 is supplied to a word line driving circuit 36a. The word line driving circuit 36a is connected to spare word lines SWLn (n=0 to 3) constructing a redundancy memory cell array 63.

Figure 13:
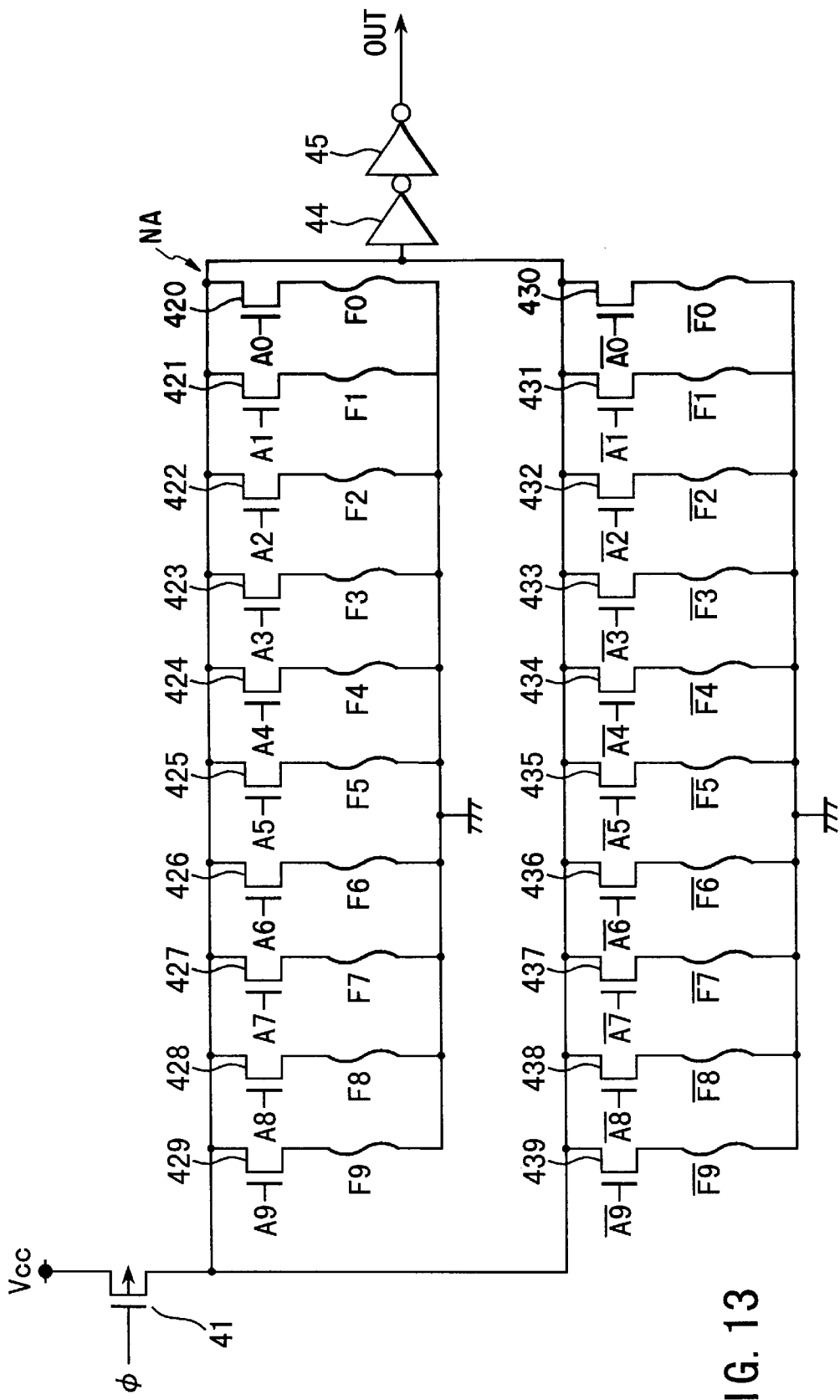
FIG. 13 is a circuit diagram showing an address coincidence detection circuit of FIG. 12.

FIG. 13 shows an example of the address coincidence detection circuit ACD0 and portions which are the same as those of FIG. 6 are denoted by the same reference numerals. In addition to the circuit construction of FIG. 6, the address coincidence detection circuit ACD0 further includes a transistor 420 whose gate is supplied with the address signal A0, a fuse F0 serially connected to the transistor 420, a transistor 430 whose gate is supplied with the address signal /A0, and a fuse /F0 serially connected to the transistor 430.

Figure 14:
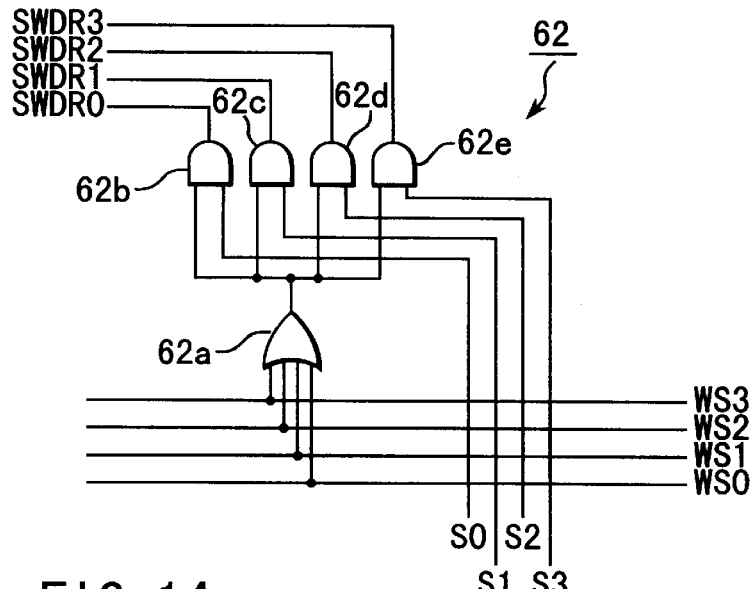
FIG. 14 is a circuit diagram showing a spare word line selecting signal generation circuit of FIG. 12.

FIG. 14 shows the spare word line selecting signal generation circuit 62. Common word line identification signals WS0 to WS3 are supplied to an OR circuit 62a. An output signal of the OR circuit 62a is supplied to AND circuits 62b, 62c, 62d, 62e together with word line address selection signals S0 to S3 output from the address coincidence detection circuits ACD0 to ACD3. Spare word line selection signals SWDR0 to SWDR3 are output from the output terminals of the AND circuits 62b to 62e.

In the second embodiment, the redundancy replacement in the unit of one word line can be effected as follows.

The word line group selection signal SMWL output from the OR circuit 61 shown in FIG. 12 is the logical OR of output signals of the four address coincidence detection circuits ACD0 to ACD3. The address coincidence detection circuits ACD0 to ACD3 of this embodiment detect coincidence of addresses by use of all of the address signals of 10 bits indicating the address of the word line. That is, when a supplied address coincides with the stored address, one of the word line address selection signals S0 to S3 is selectively activated.

The spare word line selecting signal generation circuit 62 shown in FIG. 14 is operated as shown in the table 2.

TABLE 2

| word line address signal | A1 | A0 | selected WS | activated SWDR |
|---|---|---|---|---|
| S0 | 0 | 0 | WS0 | SWDR0 |
| S0 | 0 | 1 | WS1 | SWDR0 |
| S0 | 1 | 0 | WS2 | SWDR0 |
| S0 | 1 | 1 | WS3 | SWDR0 |
| S1 | 0 | 0 | WS0 | SWDR1 |
| S1 | 0 | 1 | WS1 | SWDR1 |
| S1 | 1 | 0 | WS2 | SWDR1 |
| S1 | 1 | 1 | WS3 | SWDR1 |
| S2 | 0 | 0 | WS0 | SWDR2 |
| S2 | 0 | 1 | WS1 | SWDR2 |
| S2 | 1 | 0 | WS2 | SWDR2 |
| S2 | 1 | 1 | WS3 | SWDR2 |
| S3 | 0 | 0 | WS0 | SWDR3 |
| S3 | 0 | 1 | WS1 | SWDR3 |
| S3 | 1 | 0 | WS2 | SWDR3 |
| S3 | 1 | 1 | WS3 | SWDR3 |

That is, one of the spare word line selection signals SWDR0 to SWDR3 is selected according to the activation states of the word line address selection signals S0 to S3 when one of the common word line identification signals WS0 to WS3 is activated irrespective of the values of the addresses A0, A1 for selecting one of WS0 to WS3. The row decoder 36a drives one spare word line SWL based on the spare word line selection signals SWDR0 to SWDR3 and word line group selection signal SMWL.

With the above construction, the operation of replacing the word lines in the unit of one word line with the activation states of the common word line identification signals WS0 to WS3 kept unchanged without modifying the word line driving circuit or the like irrespective of whether the redundancy replacement is effected or not. Therefore, in the second embodiment, the redundancy memory cell array 63 may have four word lines even though four defective portions can be compensated for like the conventional case and the number of word lines can be reduced to one-fourth of 16 word line used in the conventional case. Thus, an increase in the chip area by the redundancy memory cell array 63 can be further suppressed.

(Third Embodiment)

Figure 17:
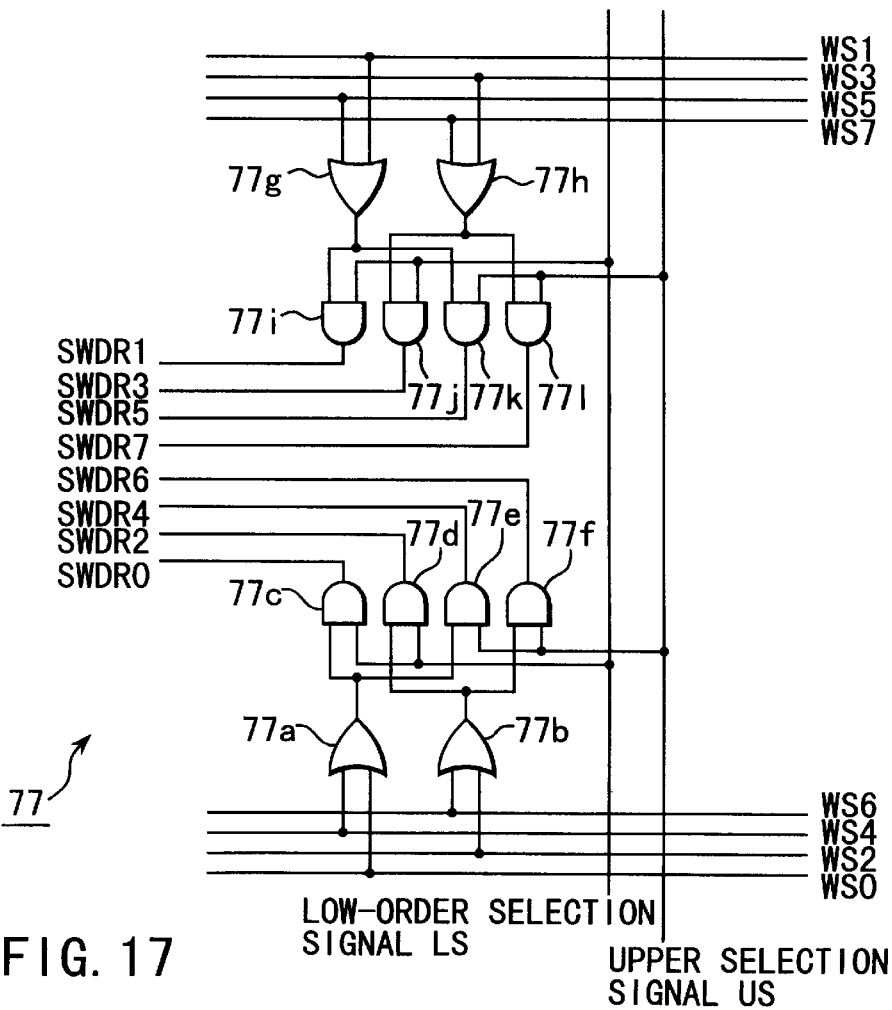
FIG. 17 is a circuit diagram showing a spare word line selecting signal generation circuit of FIG. 15.
Figure 15:
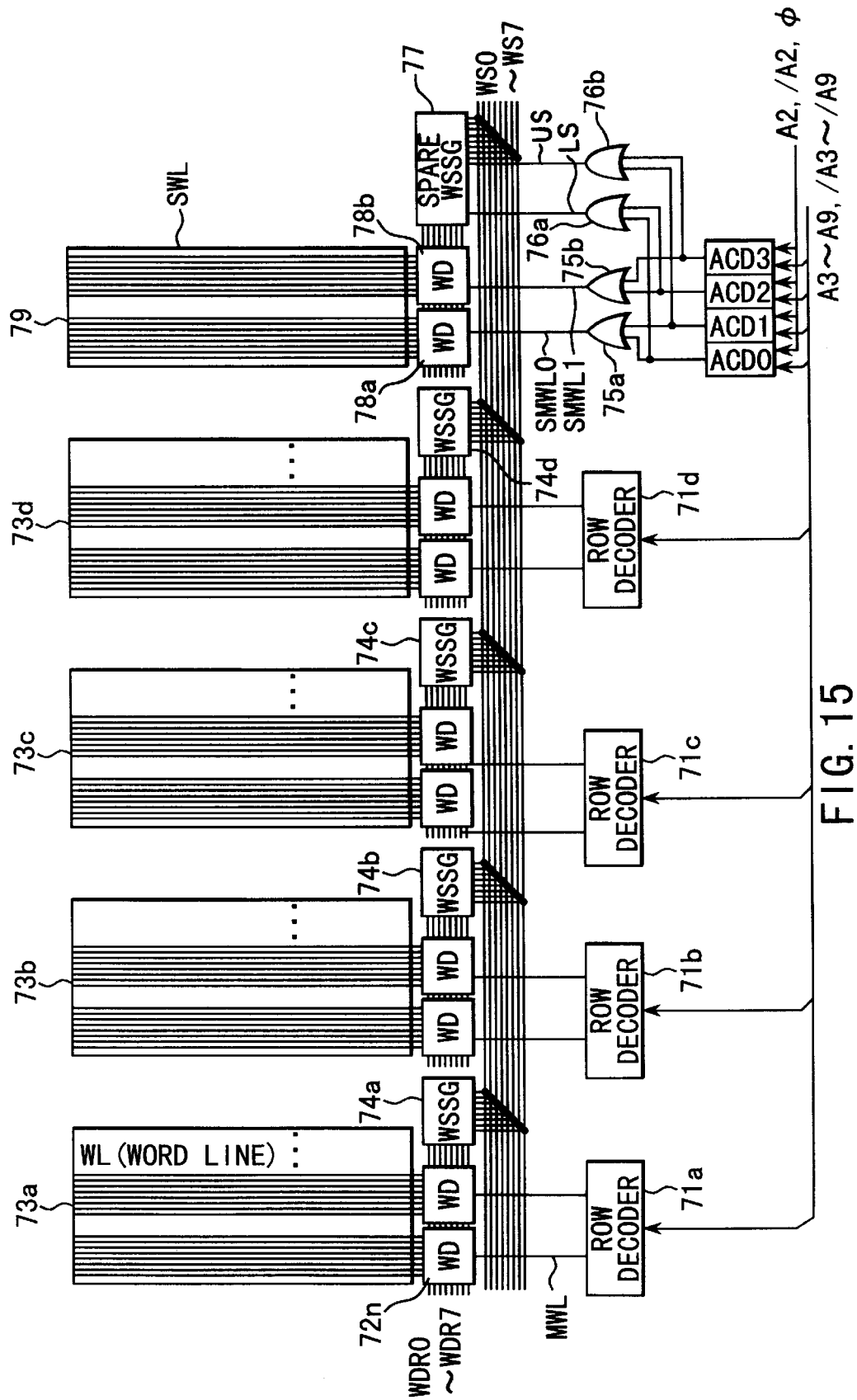
FIG. 15 is a construction diagram showing a third embodiment of this invention.

FIGS. 15 to 17 show a third embodiment of this invention.

In FIG. 15, row decoders 71a, 71b, 71c, 71d are supplied with address signals A3 to A9 of upper 7 bits among the address signals of 10 bits designating a total of 1024 word lines and inversion signals /A3 to /A9 thereof and one of word line group selection signals MWL is selectively activated by the address signals. The word line group selection signals MWL are output one for every eight word lines and a group of eight adjacent word lines is selected by one word line group selection signal MWL.

The word line group selection signals MWL are supplied to word line driving circuits 72n (n=0 to 127). Each of the word line driving circuits 72n selects one of the eight word lines according to common word line identification signals WSn (n=0 to 7). That is, the common word line identification signals WSn are generated by address signals of low-order three bits. The common word line identification signals WSn are supplied to word line selecting signal generation circuits 74a, 74b, 74c, 74d respectively arranged for memory cell arrays 73a, 73b, 73c, 73d and word line selection signals WDRn (n=0 to 7) are generated by the word line selecting signal generation circuits 74a, 74b, 74c, 74d. The word line selection signals WDRn generated by the word line selecting signal generation circuits 74a, 74b, 74c, 74d are supplied to the word line driving circuits 72n and the word line driving circuit 72n drives one word line selected by the word line selection signal WDRn and contained in the eight-word line group selected by the word line group selection signal MWL. The construction of these circuits is similar to that of the first and second embodiments.

The word line group selection signal SMWL in the redundancy memory cell array of this embodiment uses a logical OR of output signals of the two address coincidence detection circuits. That is, the address coincidence detection circuits ACD0, ACD1, ACD2, ACD3 are supplied with the upper signal A2 of the address signals A2, A1, A0 of 7 bits for identifying the common word lines WS0 to WS7, an inversion signal /A2 thereof, and a control signal $\phi$ in addition to the address signals of upper 7 bits. Each of the address coincidence detection circuits ACD0 to ACD3 activates an output signal thereof when the address signals of 8 bits coincide with the defective address of upper 8 bits previously stored by use of the fuses.

FIG. 16 shows an example of the address coincidence detection circuit ACD0. In FIG. 16, portions which are the same as those of FIGS. 6 and 13 are denoted by the same reference numerals and the explanation therefor is omitted.

Output signals of the address coincidence detection circuits ACD0, ACD1 are supplied to an OR circuit 75a and output signals of the address coincidence detection circuits ACD2, ACD3 are supplied to an OR circuit 75b. A spare word line group selection signal SMWL0 is output from the OR circuit 75a and a spare word line group selection signal SMWL1 is output from the OR circuit 75b.

When the coincidence of addresses is detected by the address coincidence detection circuit ACD0, ACD1, ACD2, ACD3, then an upper or low-order selection signal is generated. That is, the output signals of the address coincidence detection circuits ACD0, ACD2 are supplied to an OR circuit 76a and the output signals of the address coincidence detection circuits ACD1, ACD3 are supplied to an OR circuit 76b. A low-order selection signal LS is output from the OR circuit 76a and an upper selection signal US is output from the OR circuit 76b. The low-order selection signal LS and upper selection signal US are supplied to a spare word line selecting signal generation circuit 77 together with the common word line identification signals WS0 to WS7.

FIG. 17 shows the spare word line selecting signal generation circuit 77.

In FIG. 17, the common word line identification signals WS0, WS4 are supplied to the input terminals of an OR circuit 77a, and the common word line identification signals WS2, WS6 are supplied to the input terminals of an OR circuit 77b. An output signal of the OR circuit 77a and the low-order selection signal LS are supplied to the input terminals of an AND circuit 77c and an output signal of the OR circuit 77b and the low-order selection signal LS are supplied to the input terminals of an AND circuit 77d. Further, an output signal of the OR circuit 77a and the upper selection signal US are supplied to the input terminals of an AND circuit 77e and an output signal of the OR circuit 77b and the upper selection signal US are supplied to the input terminals of an AND circuit 77f. A spare word line selection signal SWDR0 is output from the output terminal of the AND circuit 77c, a spare word line selection signal SWDR2 is output from the output terminal of the AND circuit 77d, a spare word line selection signal SWDR4 is output from the output terminal of the AND circuit 77e, and a spare word line selection signal SWDR6 is output from the output terminal of the AND circuit 77f.

Further, the common word line identification signals WS1, WS5 are supplied to the input terminals of an OR circuit 77g, and the common word line identification signals WS3, WS7 are supplied to the input terminals of an OR circuit 77h. An output signal of the OR circuit 77g and the low-order selection signal LS are supplied to the input terminals of an AND circuit 77i and an output signal of the OR circuit 77h and the low-order selection signal LS are supplied to the input terminals of an AND circuit 77j. Further, an output signal of the OR circuit 77g and the upper selection signal US are supplied to the input terminals of an AND circuit 77k and an output signal of the OR circuit 77h and the upper selection signal US are supplied to the input terminals of an AND circuit 77l. A spare word line selection signal SWDR1 is output from the output terminal of the AND circuit 77i, a spare word line selection signal SWDR3 is output from the output terminal of the AND circuit 77j, a spare word line selection signal SWDR5 is output from the output terminal of the AND circuit 77k, and a spare word line selection signal SWDR7 is output from the output terminal of the AND circuit 77l.

The spare word line selection signals SWDR0 to SWDR7 are supplied to spare word line driving circuits 78a, 78b having the same construction as the word line driving circuit together with the spare word line group selection signals SMWL0, SMWL1. The spare word line driving circuits 78a, 78b are each connected to eight spare word lines SWL constructing a redundancy memory cell array 79. Each of the spare word line driving circuits 78a, 78b selects a spare word line according to the spare word line selection signals SWDR0 to SWDR7 and spare word line group selection signal SMWL0 or SMWL1.

The operation as indicated by the table 3 can be attained by use of the circuit of this embodiment.

TABLE 3

| upper/low-order selection signal | A2 | A1 | A0 | selected WS | activated SWDR |
|---|---|---|---|---|---|
| low | 0 | 0 | 0 | WS0 | SWDR0 |
| low | 0 | 0 | 1 | WS1 | SWDR1 |
| low | 0 | 1 | 0 | WS2 | SWDR2 |
| low | 0 | 1 | 1 | WS3 | SWDR3 |
| low | 1 | 0 | 0 | WS4 | SWDR0 |
| low | 1 | 0 | 1 | WS5 | SWDR1 |
| low | 1 | 1 | 0 | WS6 | SWDR2 |
| low | 1 | 1 | 1 | WS7 | SWDR3 |
| upper | 0 | 0 | 0 | WS0 | SWDR4 |
| upper | 0 | 0 | 1 | WS1 | SWDR5 |
| upper | 0 | 1 | 0 | WS2 | SWDR6 |
| upper | 0 | 1 | 1 | WS3 | SWDR7 |
| upper | 1 | 0 | 0 | WS4 | SWDR4 |
| upper | 1 | 0 | 1 | WS5 | SWDR5 |
| upper | 1 | 1 | 0 | WS6 | SWDR6 |
| upper | 1 | 1 | 1 | WS7 | SWDR7 |

Thus, a level of the most significant bit A2 among the address signals A0, A1, A2 of three bits for identifying the common word line identification signals WS0 to WS7 is replaced according to the upper/low-order selection signals US, LS and one of SWDR0 to SWDR7 to be activated is selected. That is, when the upper selection signal US is activated, A2="1", and when the low-order selection signal LS is activated, A2="0".

Also, by the third embodiment, the number of word lines to be replaced as one unit can be reduced from eight which is the pitch of the lines of the word line group selection signals to four without modifying the word line driving circuit or the like with the activation state of the common word line identification signals WS0 to WS3 kept unchanged irrespective of whether the redundancy replacement is effected or not. As a result, the redundancy memory cell array can be made smaller in comparison with the conventional case and an increase in the chip area by the redundancy memory cell array can be prevented.

(Fourth Embodiment)

Figure 19:
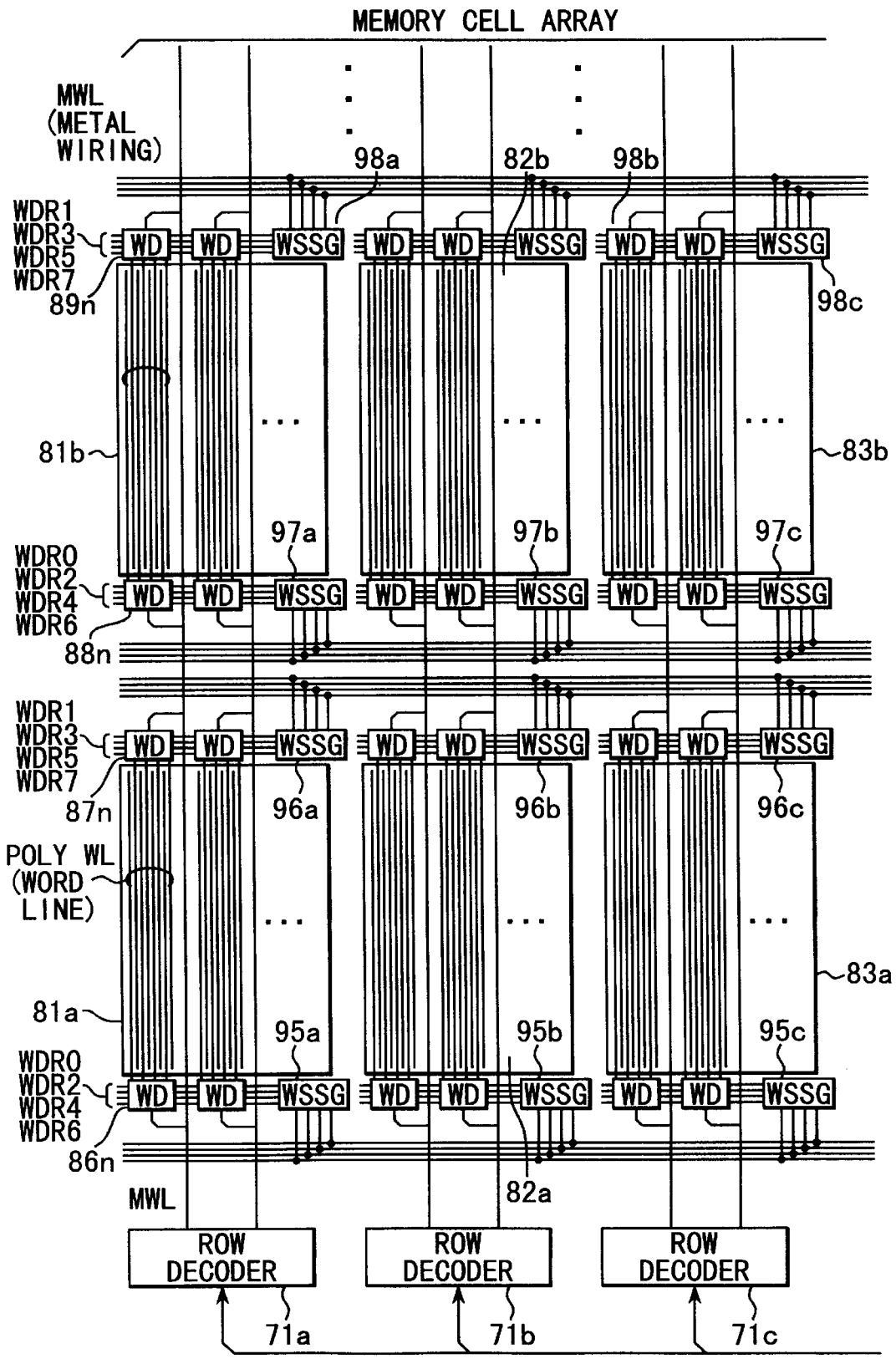
FIG. 19 is a construction diagram showing the fourth embodiment of this invention.
Figure 20:
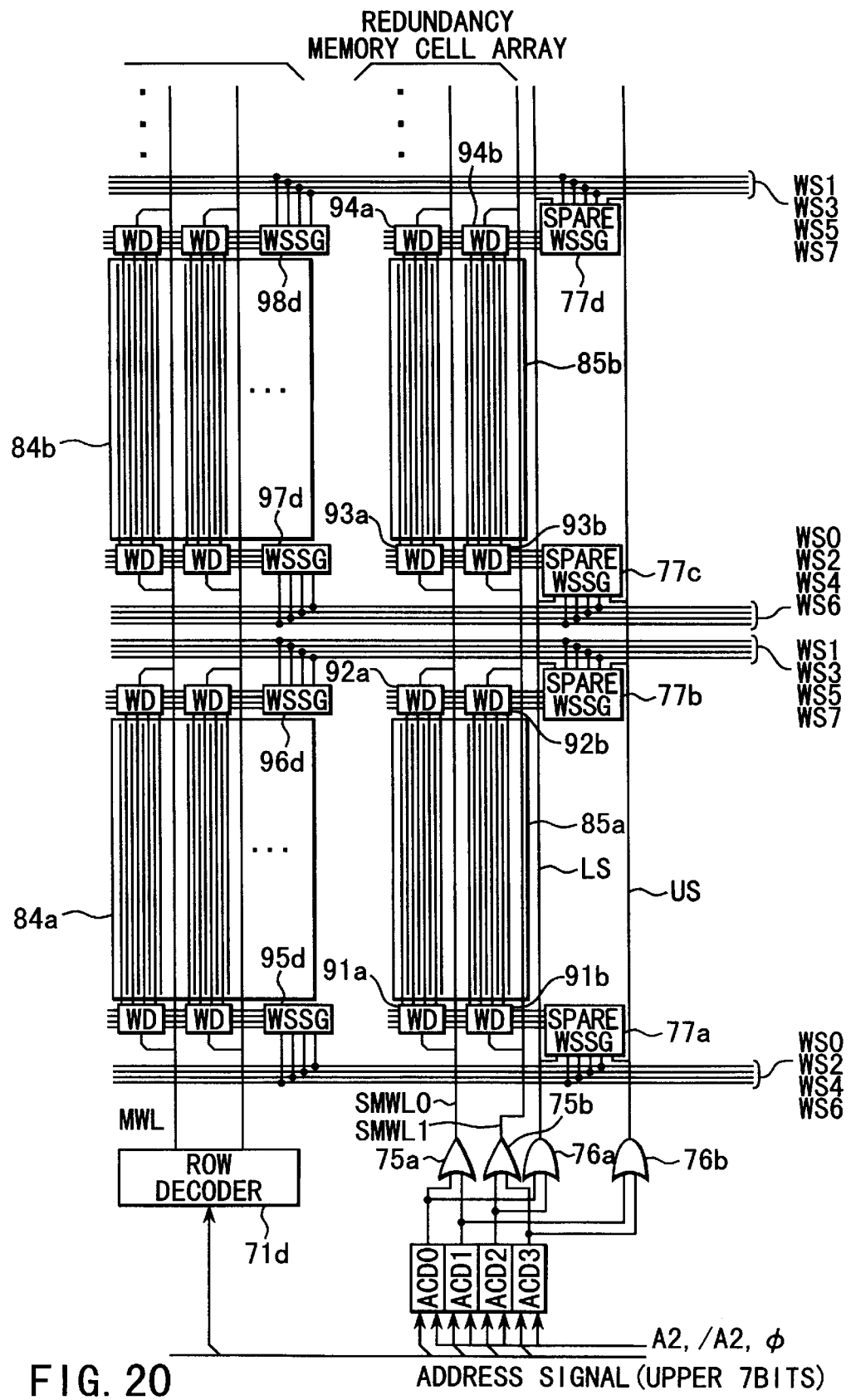
FIG. 20 is a construction diagram showing the fourth embodiment of this invention.
Figure 21:
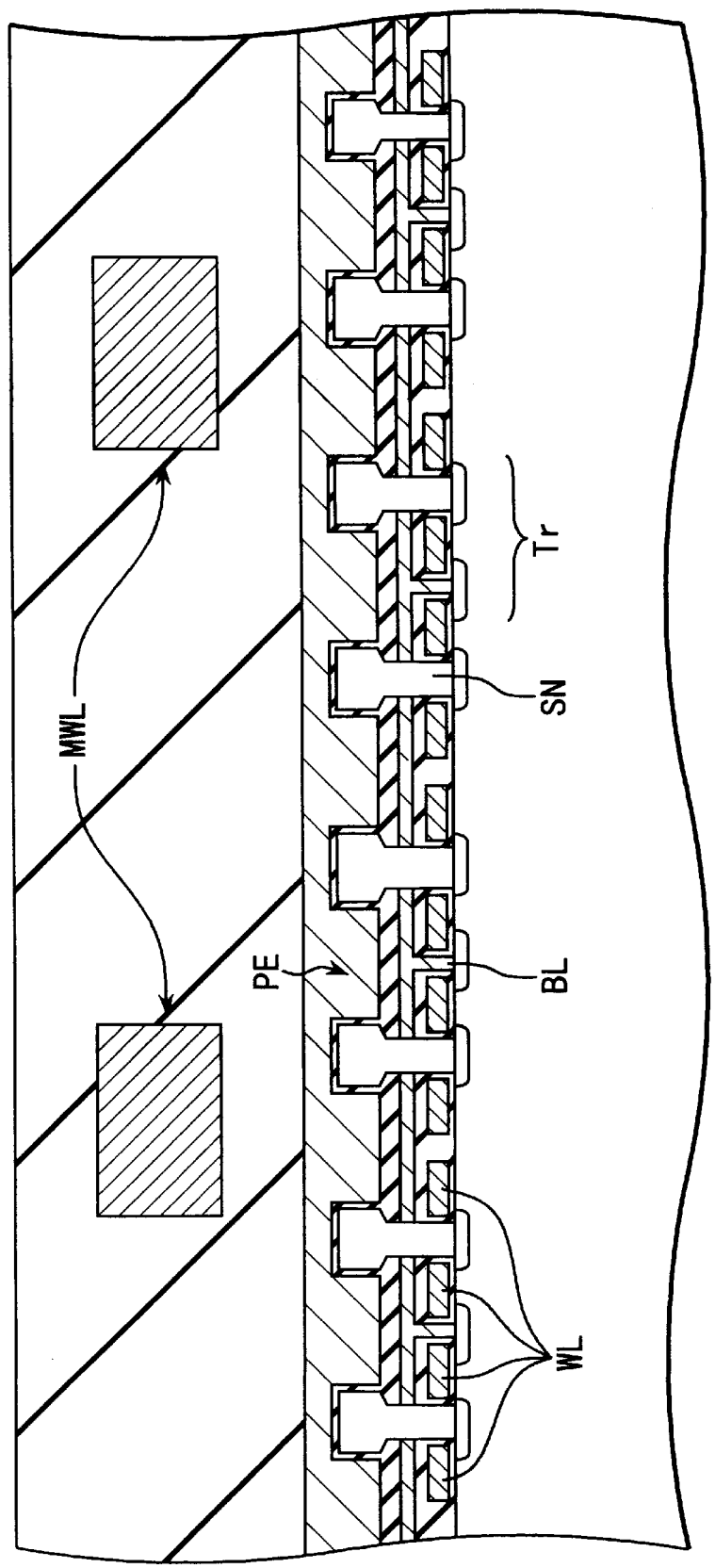
FIG. 21 is a cross sectional view showing the main portion of the fourth embodiment of this invention.

FIGS. 18 to 21 show a fourth embodiment of this invention. The present embodiment is attained by modifying the third embodiment and indicates a case wherein this invention is applied to a semiconductor memory device with a hierarchical word line structure. FIG. 18 shows the relation of FIGS. 19 and 20, FIG. 19 shows a memory cell array section, and FIG. 20 shows part of the memory cell array section and a redundancy memory cell array section. In FIGS. 19, 20, portions which are the same as those of FIG. 15 are denoted by the same reference numerals. FIG. 21 shows a cross section of the memory cell array.

In FIGS. 19, 20, memory cell arrays 81a, 81b, . . . , 82a, 82b, . . . , 83a, 83b, . . . , 84a, 84b, . . . are arranged in the row and column directions on the chip. Redundancy memory cell arrays 85a, 85b, . . . are arranged along the memory cell arrays 84a, 84b, . . . . Word line driving circuits 86n, 87n (n=0 to 127) are arranged on both sides of the memory cell arrays 81a, 82a, 83a, 84a, and word line driving circuits 88n, 89n (n=0 to 127) are arranged on both sides of the memory cell arrays 81b, 82b, 83b, 84b. Each of the driving circuits is connected to four word lines WL. The odd-numbered word lines are driven by the word line driving circuits arranged on one side of the memory cell arrays and the even-numbered word lines are driven by the word line driving circuits arranged on the other side of the memory cell arrays.

Spare word line driving circuits 91a, 91b, 92a, 92b having the same construction as the word line driving circuits 86n, 87n, 88n, 89n are arranged on both sides of the redundancy memory cell array 85a and spare word line driving circuits 93a, 93b, 94a, 94b are arranged on both sides of the redundancy memory cell array 85b. Each of the spare word line driving circuits is connected to four spare word lines SWL. Lines for word line group selection signals MWL output from row decoders 71a, 71b, 71c, 71d on the respective columns extend across the memory cell arrays and connected to the word line driving circuits arranged on the respective columns. Each of the lines for the word line group selection signals MWL is provided for every eight word lines WL.

Word line selecting signal generation circuits 95a, 95b, 95c, 95d, 96a, 96b, 96c, 96d are arranged on both sides of the memory cell arrays 81a, 82a, 83a, 84a and word line selecting signal generation circuits 97a, 97b, 97c, 97d, 98a, 98b, 98c, 98d are arranged on both sides of the memory cell arrays 81b, 82b, 83b, 84b. Spare word line selecting signal generation circuits 77a, 77b are arranged on both sides of the redundancy memory cell 85a, and spare word line selecting signal generation circuits 77c, 77d are arranged on both sides of the redundancy memory cell array 85b.

In this embodiment, WS0, WS2, WS4, WS6 of eight common word line identification signals WS0 to WS7 are supplied to the word line selecting signal generation circuits 95a to 95d, 97a to 97d and the spare word line selecting signal generation circuits 77a, 77c which are arranged on the lower sides of the respective memory cell arrays, and WS1, WS3, WS5, WS7 are supplied to the word line selecting signal generation circuits 96a to 96d, 98a to 98d and the spare word line selecting signal generation circuits 77b, 77d which are arranged on the upper sides of the respective memory cell arrays.

The word lines WL selected by the common word line identification signals WS0 to WS7 and the word line group selection signals MWL are respectively driven by the word line driving circuits arranged on the upper side and lower side of the memory cell arrays.

As shown in FIG. 21, each of the word lines is formed of a polysilicon layer constructing the gate electrodes of memory cell transistors Tr and the line for the word line group selection signal MWL for selecting the eight word lines as one word line group is arranged on a level higher than the memory cells and is formed of a metal wiring layer. The pitch of the lines for the word line group selection signals MWL is larger than the pitch of the word lines WL. In FIG. 21, BL is a bit line, SN is a storage node constructing a capacitor and PE is a plate electrode.

The principle of the operation of this embodiment is exactly the same as that of the third embodiment. In this embodiment, the number of word lines to be replaced as one unit can be reduced from eight which is the pitch of the lines of the word line group selection signals MWL to four by use of the upper/low-order selection signals generated by output signals of the address coincidence detection circuits. Therefore, an increase in the chip area due to formation of the redundancy memory cell arrays can be prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor memory device comprising:

a plurality of memory cell arrays each having a plurality of word lines;

at least one redundancy memory cell array having a plurality of spare word lines;

a plurality of word line group selecting circuit for selecting word line groups each including at least two word lines according to a first portion of an address signal;

a plurality of word line selecting circuits respectively provided for said plurality of memory cell arrays, for selecting one of the plurality of word lines contained in the word line group which is selected by said word line group selecting circuits according to a second portion of the address signal;

an address coincidence detection circuit including a plurality of nonvolatile storage circuits for storing a part of address bits of a specific word line contained in the word line groups according to part of the first and second portions of the address signals and outputting a coincidence signal when corresponding address signal for selecting the word line of said memory cell array coincides with the address signal stored in said storage circuit; and a replacement circuit provided for said redundancy memory cell array, for replacing one of the spare word lines of a preset number smaller than the number of word lines constructing the word line group instead of the word line according to an output signal of said address coincidence detection circuit.

2. A device according to claim 1, wherein the number of word lines contained in the word line group is two and the number of word lines to be replaced by said replacement circuit is one.

3. A device according to claim 1, wherein the number of word lines contained in the word line group is four and the number of word lines to be replaced by said replacement circuit is one of one and two.

4. A device according to claim 1, wherein the number of word lines contained in the word line group is eight and the number of word lines to be replaced by said replacement circuit is one of one, two and four.

5. A device according to claim 1, wherein the number of word lines contained in the word line group is 16 and the number of word lines to be replaced by said replacement circuit is one of one, two and four.

6. A device according to claim 1, wherein the number of word lines contained in the word line group is two to the n-th power (n is a positive integer) and the number of word lines to be replaced by said replacement circuit is two to the m-th power (m is an integer smaller than n).

7. A semiconductor memory device comprising:
 a plurality of memory cell arrays each having a plurality of word lines;
 at least one redundancy memory cell array having a plurality of spare word lines;
 a plurality of word line group selecting circuits respectively provided for said plurality of memory cell arrays, for generating word line group selecting signals which select a plurality of word line groups each including at least two word lines according to a first portion of an address signal;
 a plurality of word line selecting circuits respectively provided for said plurality of memory cell arrays, each for selecting one of the plurality of word lines contained in a corresponding one of the selected word line groups according to one of a plurality of common word line identification signals generated by a second portion of the address signal and the word line group selection signal supplied from a corresponding one of said word line group selection circuits;
 a plurality of spare word line group selection circuits provided for said redundancy memory cell array, each for selecting a spare word line group constructed by the spare word lines of the same number as the number of word lines contained in the word line group;
 a plurality of address coincidence detection circuits each including a nonvolatile storage circuit for storing a part of address bits of a specific word line, for activating an output signal thereof when at least part of the first and second portions of the address signal supplied at the time of access to the word line coincides with the address signal stored in said storage circuit;
 a first generation circuit for generating a spare word line group selection signal for selecting one of said spare word line group selection circuits when at least one of the output signals of said address coincidence detection circuits is activated;
 a second generation circuit for generating selection control signals of a number smaller than the number of word lines contained in the word line group when at least one of the output signals of said address coincidence detection circuits is activated; and
 a spare word line selecting signal generation circuit for generating a spare word line selection signal for selecting the spare word line from the spare word line group selected by the spare word line group selection signal according to the selection control signals generated by said second generation circuit and the common word line identification signal and supplying the spare word line selection signal to said spare word line group selection circuit.

8. A device according to claim 7, wherein the number of common word line selection signals is equal to or an integral multiple of the number of word lines contained in the word line group.

9. A device according to claim 7, wherein the number of word lines contained in the word line group, the number of spare word lines contained in the spare word line group, and the number of common word line identification signals are set to two to the k-th (k is a positive integer) power.

10. A device according to claim 9, wherein the common word line identification signal is expressed by k (k is a positive integer) address signals, and said spare word line selecting signal generation circuit generates the spare word line selection signal by replacing i (i is a positive integer not larger than k) address signals among the k address signals by use of said address coincidence detection circuit.

11. A device according to claim 7, further comprising metal wiring layers arranged above said memory cell arrays and redundancy memory cell array, for transmitting the word line group selection signal and spare word line group selection signal.

12. A device according to claim 7, wherein said first generation circuit includes an OR circuit for generating the spare word line group selection signal from the output signals of said plurality of address coincidence detection circuits.

13. A device according to claim 7, wherein said second generation circuit includes an OR circuit for generating the selection control signal from the output signals of said plurality of address coincidence detection circuits.

14. A semiconductor memory device comprising:
 a plurality of memory cell arrays each having a plurality of word lines;
 at least one redundancy memory cell array having a plurality of spare word lines;
 a plurality of word line group selecting circuits respectively provided for said plurality of memory cell arrays, for generating word line group selecting signals which select a plurality of word line groups each including at least two word lines according to a first portion of an address signal;
 a plurality of word line selecting circuits respectively provided for said plurality of memory cell arrays, each for selecting one of the plurality of word lines contained in a corresponding one of the selected word line groups according to a plurality of common word line identification signals generated by a second portion of the address signal and the word line group selection signal supplied from a corresponding one of said word line group selection circuits;
 a spare word line group selection circuit provided for said redundancy memory cell array, for selecting a spare word line group constructed by the spare word lines of the same number as the number of word lines contained in the word line group;
 a plurality of address coincidence detection circuits each including a nonvolatile storage circuit for storing a part of address of a specific word line, for activating an output signal thereof when at least part of the first and second portions of the address signal supplied at the time of access to the word line coincides with the address signal stored in said storage circuit;

a generation circuit for generating a spare word line group selection signal for selecting one of said spare word line group selection circuits when at least one of the output signals of said address coincidence detection circuits is activated; and a spare word line selection circuit connected to said spare word line group selection circuits, for selecting spare word lines of a number smaller than the number of word lines contained in the word line group when one of the output signals of said plurality of address coincidence detection circuits is activated in a case where a spare word line is selected from the spare word line group selected by the spare word line group selection signal according to the common word line identification signal.

15. A device according to claim 14, wherein the number of common word line selection signals is equal to or an integral multiple of the number of word lines contained in the word line group.

16. A device according to claim 14, wherein the number of word lines contained in the word line group, the number of spare word lines contained in the spare word line group, and the number of common word line identification signals are set to two to the k-th (k is a positive integer) power.

17. A device according to claim 14, further comprising metal wiring layers arranged above said memory cell arrays and redundancy memory cell array, for transmitting the word line group selection signal and spare word line group selection signal.

18. A device according to claim 14, wherein said generation circuit includes an OR circuit for generating the spare word line group selection signal from the output signals of said plurality of address coincidence detection circuits.

19. A semiconductor memory device comprising:

a plurality of memory cell arrays each having a plurality of word lines;

a plurality of redundancy memory cell arrays each having a plurality of spare word lines;

a plurality of row decoders respectively provided for said plurality of memory cell arrays, for generating word line group selecting signals which select a plurality of word line groups each including at least two word lines of said plurality of memory cell arrays according to a first portion of an address signal;

a plurality of word line selecting signal generation circuits provided on both sides of said plurality of memory cell arrays, each for generating a word line selection signal which selects the word line according to a plurality of common word line identification signals generated by a second portion of the address signal;

a plurality of word line driving circuits provided on both sides of said plurality of memory cell arrays, each for activating one of the word lines in the word line group selected by said row decoders according to the word line group selection signal and word line selecting signal;

a plurality of spare word line group selection circuits provided on both sides of said redundancy memory cell arrays, for selecting a spare word line group constructed by the spare word lines of the same number as the number of word lines contained in the word line group;

a plurality of address coincidence detection circuits each including a nonvolatile storage circuit for storing a part of address signal of a specific word line, each for activating an output signal thereof when the first and second portions of the address signal coincide with the address signal stored in said storage circuit;

a generation circuit for generating a spare word line group selection signal for selecting one of said spare word line group selection circuits when at least one of the output signals of said address coincidence detection circuits is activated; and a spare word line selection signal generation circuit for generating a spare word line selection signal to supply a signal for selecting the spare word line when one of the output signals of said plurality of address coincidence detection circuits is activated and supplying the spare word line selection signal to said spare word line group selection circuits.

20. A device according to claim 19, wherein said generation circuit includes an OR circuit for generating the spare word line group selection signal from the output signals of said plurality of address coincidence detection circuits.

21. A device according to claim 19, further comprising metal wiring layers arranged above said memory cell arrays and redundancy memory cell arrays, for transmitting the word line group selection signal and spare word line group selection signal.

* * * * *